US009547399B2

(12) United States Patent
Olson et al.

(10) Patent No.: US 9,547,399 B2
(45) Date of Patent: Jan. 17, 2017

(54) INJECTED TOUCH NOISE ANALYSIS

(71) Applicant: Parade Technologies, Ltd., Santa Clara, CA (US)

(72) Inventors: Dana Olson, Kirkland, WA (US); Andriy Maharyta, Lviv (UA); Steve Kolokowsky, San Diego, CA (US)

(73) Assignee: PARADE TECHNOLOGIES, LTD., Santa Clara, CA (US)

( * ) Notice: Subject to any disclaimer, the term of this patent is extended or adjusted under 35 U.S.C. 154(b) by 75 days.

(21) Appl. No.: 14/525,025

(22) Filed: Oct. 27, 2014

(65) Prior Publication Data

US 2015/0199046 A1    Jul. 16, 2015

Related U.S. Application Data

(63) Continuation of application No. 14/134,406, filed on Dec. 19, 2013, now Pat. No. 8,874,396.

(60) Provisional application No. 61/840,655, filed on Jun. 28, 2013, provisional application No. 61/861,192, filed on Aug. 1, 2013.

(51) Int. Cl.
| | | |
|---|---|---|
| *G06F 3/044* | (2006.01) | |
| *G06F 3/041* | (2006.01) | |
| *G06F 3/045* | (2006.01) | |
| *G06F 3/0488* | (2013.01) | |
| *G06F 3/0354* | (2013.01) | |
| *H03K 17/96* | (2006.01) | |

(52) U.S. Cl.
CPC ........... *G06F 3/044* (2013.01); *G06F 3/03545* (2013.01); *G06F 3/045* (2013.01); *G06F 3/0416* (2013.01); *G06F 3/0418* (2013.01); *G06F 3/04886* (2013.01); *H03K 17/9622* (2013.01); *G06F 2203/04809* (2013.01); *H03K 2217/960705* (2013.01)

(58) Field of Classification Search
CPC ........ G06F 3/044; G06F 3/0416; G06F 3/041; G06F 3/0488
USPC .................................... 702/69; 345/173, 174
See application file for complete search history.

(56) References Cited

U.S. PATENT DOCUMENTS

| | | | |
|---|---|---|---|
| 6,392,636 B1 * | 5/2002 | Ferrari | ................ G06F 3/03547 345/157 |
| 6,826,968 B2 * | 12/2004 | Manaresi | ................. B63H 9/06 73/862.046 |
| 7,362,313 B2 | 4/2008 | Geaghan et al. | |
| 8,054,299 B2 * | 11/2011 | Krah | ..................... G06F 3/0416 178/18.06 |
| 8,248,081 B2 | 8/2012 | Maharyta et al. | |
| 8,279,180 B2 | 10/2012 | Hotelling et al. | |

(Continued)

OTHER PUBLICATIONS

Search Report for U.S. Appl. No. 14/134,406, "Injected Touch Noise Metric," Nov. 2013, 5 pgs.

(Continued)

*Primary Examiner* — Carol S Tsai
(74) *Attorney, Agent, or Firm* — Morgan, Lewis & Bockius LLP

(57) ABSTRACT

A processing device configured to induce, during a listening scan of a sense array, an injected touch to produce similar data as would be present during a touch scan of the sense array with a conductive object at a known location on the sense array. The processing device is further configured to compute, using the data, an estimate of a noise metric based on the injected touch.

20 Claims, 17 Drawing Sheets

(56) References Cited

U.S. PATENT DOCUMENTS

| | | | |
|---|---|---|---|
| 8,294,687 B1* | 10/2012 | Ksondzyk | G06F 3/0418 178/18.01 |
| 8,300,019 B2 | 10/2012 | Elias et al. | |
| 8,436,829 B1 | 5/2013 | Zhai et al. | |
| 2002/0121146 A1* | 9/2002 | Manaresi | B63H 9/06 73/862.68 |
| 2006/0202969 A1 | 9/2006 | Hauck | |
| 2008/0106520 A1 | 5/2008 | Free et al. | |
| 2008/0165134 A1* | 7/2008 | Krah | G06F 3/044 345/173 |
| 2010/0097078 A1 | 4/2010 | Phillip et al. | |
| 2012/0043142 A1* | 2/2012 | Grivna | G06F 3/044 178/19.03 |
| 2012/0050216 A1* | 3/2012 | Kremin | G06F 3/044 345/174 |
| 2012/0105353 A1 | 5/2012 | Brossnan | |
| 2012/0105354 A1* | 5/2012 | Narasimhan | G06F 3/044 345/174 |
| 2012/0133594 A1* | 5/2012 | Edwards | G06F 3/044 345/173 |
| 2012/0200524 A1* | 8/2012 | Vallis | G06F 3/044 345/174 |
| 2012/0268415 A1* | 10/2012 | Konovalov | G06F 3/044 345/174 |
| 2012/0268416 A1* | 10/2012 | Pirogov | G06F 3/044 345/174 |
| 2013/0100071 A1 | 4/2013 | Wright et al. | |
| 2013/0106779 A1* | 5/2013 | Company Bosch | G06F 3/0418 345/174 |
| 2013/0113761 A1 | 5/2013 | Van Lieshout et al. | |
| 2013/0234978 A1* | 9/2013 | Ksondzyk | G06F 3/0418 345/174 |
| 2014/0023210 A1* | 1/2014 | Sheng | H04R 3/00 381/114 |
| 2014/0028623 A1* | 1/2014 | Edwards | G06F 3/0416 345/174 |

OTHER PUBLICATIONS

Olson, Office Action, U.S. Appl. No. 14/134,406, Feb. 12, 2014, 7 pgs.

Olson, Final Office Action, U.S. Appl. No. 14/134,406, May 16, 2014, 9 pgs.

Olson, Notice of Allowance, U.S. Appl. No. 14/134,406, Sep. 11, 2014, 10 pgs.

International Search Report and Written Opinion, PCT/US2013/077780, May 28, 2014, 8 pgs.

* cited by examiner

| $S_{80}$ | $S_{81}$ | $S_{82}$ | $S_{83}$ | $S_{84}$ | $S_{85}$ | $S_{86}$ | $S_{87}$ | $S_{88}$ |
|---|---|---|---|---|---|---|---|---|
| $S_{70}$ | $S_{71}$ | $S_{72}$ | $S_{73}$ | $S_{74}$ | $S_{75}$ | $S_{76}$ | $S_{77}$ | $S_{78}$ |
| $S_{60}$ | $S_{61}$ | $S_{62}$ | $S_{63}$ | $S_{64}$ | $S_{65}$ | $S_{66}$ | $S_{67}$ | $S_{68}$ |
| $S_{50}$ | $S_{51}$ | $S_{52}$ | $S_{53}$ | $S_{54}$ | $S_{55}$ | $S_{56}$ | $S_{57}$ | $S_{58}$ |
| $S_{40}$ | $S_{41}$ | $S_{42}$ | $S_{43}$ | $S_{44}$ | $S_{45}$ | $S_{46}$ | $S_{47}$ | $S_{48}$ |
| $S_{30}$ | $S_{31}$ | $S_{32}$ | $S_{33}$ | $S_{34}$ | $S_{35}$ | $S_{36}$ | $S_{37}$ | $S_{38}$ |
| $S_{20}$ | $S_{21}$ | $S_{22}$ | $S_{23}$ | $S_{24}$ | $S_{25}$ | $S_{26}$ | $S_{27}$ | $S_{28}$ |
| $S_{10}$ | $S_{11}$ | $S_{12}$ | $S_{13}$ | $S_{14}$ | $S_{15}$ | $S_{16}$ | $S_{17}$ | $S_{18}$ |
| $S_{00}$ | $S_{01}$ | $S_{02}$ | $S_{03}$ | $S_{04}$ | $S_{05}$ | $S_{06}$ | $S_{07}$ | $S_{08}$ |

Injected touch 601 (2X2)

Cells of Sense Array 600

FIG. 6

*FreqInd* - Frequency Index. What the frequency number should be used now.
*FREQNUM* – Maximum Amount of Frequencies.
*Noise* – Array with listener scan data for all frequencies.
*OpFreq* – Frequency that is used for Touch Scan Freqind - Frequency Index. What the frequency number should be used now.
FREQNUM – Maximum Amount of Frequencies.
Noise – Array with listener scan data for all frequencies.
OpFreq – Frequency that is used for Touch Position Scan

INJECTED TOUCH NOISE ANALYSIS

RELATED APPLICATIONS

This application is a continuation of U.S. patent application Ser. No. 14/134,406, filed Dec. 19, 2013, which claims the benefit of U.S. Provisional Application No. 61/840,655, filed Jun. 28, 2013, and U.S. Provisional Application No. 61/861,192, filed Aug. 1, 2013, all of which are incorporated by reference herein in their entirety.

TECHNICAL FIELD

The present disclosure relates generally to sensing systems, and more particularly to capacitance-sensing systems configurable to determine touch locations of touches on the capacitance-sensing systems.

BACKGROUND

Capacitance sensing systems can sense electrical signals generated on electrodes that reflect changes in capacitance. Such changes in capacitance can indicate a touch event (i.e., the proximity of an object to particular electrodes). Capacitive sense elements may be used to replace mechanical buttons, knobs and other similar mechanical user interface controls. The use of a capacitive sense element allows for the elimination of complicated mechanical switches and buttons, providing reliable operation under harsh conditions. In addition, capacitive sense elements are widely used in modern customer applications, providing user interface options in existing products. Capacitive sense elements can range from a single button to a large number arranged in the form of a capacitive sense array for a touch-sensing surface.

Transparent touch screens that utilize capacitive sense arrays are ubiquitous in today's industrial and consumer markets. They can be found on cellular phones, GPS devices, set-top boxes, cameras, computer screens, MP3 players, digital tablets, and the like. The capacitive sense arrays work by measuring the capacitance of a capacitive sense element, and looking for a delta in capacitance indicating a touch or presence of a conductive object. When a conductive object (e.g., a finger, hand, or other object) comes into contact or close proximity with a capacitive sense element, the capacitance changes and the conductive object is detected. The capacitance changes of the capacitive touch sense elements can be measured by an electrical circuit. The electrical circuit converts the measured capacitances of the capacitive sense elements into digital values.

There are two typical types of capacitance: 1) mutual capacitance where the capacitance-sensing circuit has access to both electrodes of the capacitor; 2) self-capacitance where the capacitance-sensing circuit has only access to one electrode of the capacitor where the second electrode is tied to a DC voltage level or is parasitically coupled to Earth Ground. A touch panel has a distributed load of capacitance of both types (1) and (2) and some touch solutions sense both capacitances either uniquely or in hybrid form with its various sense modes.

BRIEF DESCRIPTION OF THE DRAWINGS

The present invention is illustrated by way of example, and not of limitation, in the figures of the accompanying drawings.

FIG. 6 is an example of cells of a sense array, according to one embodiment.

DETAILED DESCRIPTION

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

In electronic receivers, such as in a touch sensor system, noise may be coupled into the receiving system, resulting in corrupt measurements. In a touch sensor system, noise may be coupled from a conductive object, such as a finger, to the touch system sensor resulting in large errors in computed finger positions. The embodiments described herein are directed at inducing an injected touch to produce similar data as would be present during a touch scan of a sense array with a conductive object, such as finger, being disposed on the sense array, and computing a noise metric based on the injected touch. By computing a noise metric based on an injected touch a touch sensor system may be tuned to operate at frequencies that reject the noise. By inducing an injected touch, the embodiments described herein can provide an improved system that may accurately measure noise and effectively reject the noise. The embodiments described herein may provide an improved system that reduces the deleterious effects of noise on measurement in a transmit and receive system. Alternatively, other advantages may be achieved.

Figure 1:
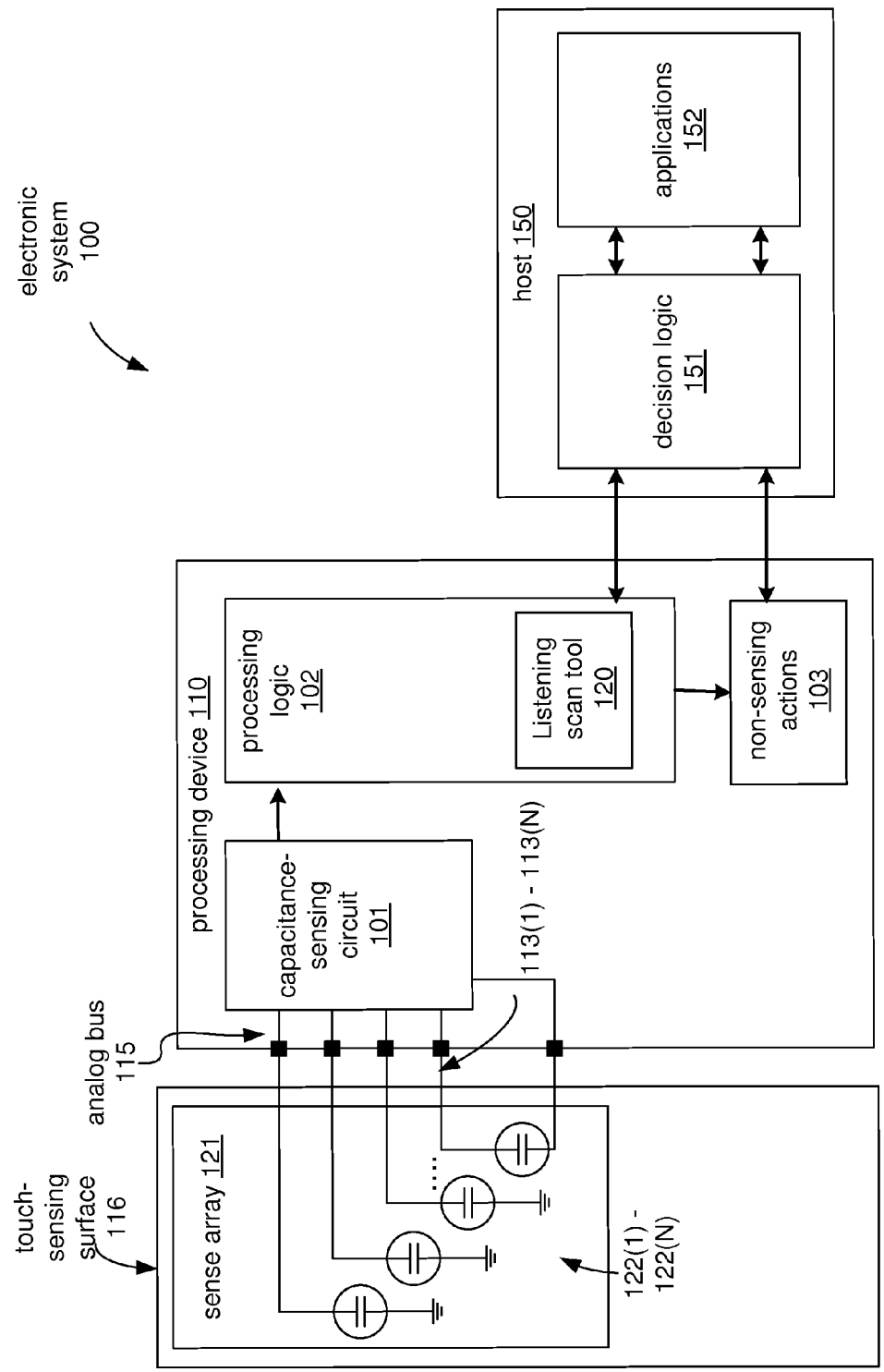
FIG. 1 is a block diagram illustrating an embodiment of an electronic system that processes touch data.

FIG. 1 is a block diagram illustrating an embodiment of an electronic system that processes touch data. FIG. 1 illustrates an electronic system 100 including a processing device 110 that may be configured to measure capacitances from a touch-sensing surface 116 including a sense array 121 (e.g., capacitive-sense array) with Listening Scan Tool 120. In one embodiment, a multiplexer circuit may be used to connect a capacitance-sensing circuit 101 with a sense array 121. The electronic system 100 includes a touch-sensing surface 116 (e.g., a touchscreen, or a touch pad) coupled to the processing device 110, which is coupled to a host 150. In one embodiment the touch-sensing surface 116 is a two-dimensional sense array 121 that uses processing device 110 to detect touches on the surface 116.

In one embodiment, listening scan tool 120 may induce, during a listening scan (i.e., metric scans) of a sense array, an injected touch to produce similar data as would be present during a touch scan of the sense array. Listening scan tool 120 may compute, using the data, an estimate of a noise metric based on the injected touch; the noise metric indicative of noise characteristics of noise on the sense array. In one embodiment, listening scan tool 120 performs a listening scan while the transmission signal is turned off. When the transmission signal is turned off, listening scan tool 120 may be able to better detect environmental noise. In another embodiment, listening scan tool 120 performs a listening scan for a plurality of frequencies and generates noise metrics for each frequency. Listening scan tool 120 may select a stimulus signal (TX signal) from a plurality of stimulus signals for a touch scan based on the different noise metrics. In one embodiment, listening scan tool 120 selects a transmission frequency for which a noise metric indicates a minimum noise response. Additional details of listening scan tool 120 are described in more detail with respect to FIGS. 4-11B.

In one embodiment, the sense array 121 includes electrodes 122(1)-122(N) (where N is a positive integer) that are disposed as a two-dimensional matrix (also referred to as an XY matrix). The sense array 121 is coupled to pins 113(1)-113(N) of the processing device 110 via one or more analog buses 115 transporting multiple signals. In sense array 121, the first three electrodes (i.e., electrodes 122(1)-(3)) are connected to capacitance-sensing circuit 101 and to ground, illustrating a self-capacitance configuration. The last electrode (i.e., 122(N)) has both terminals connected to capacitance-sensing circuit 101, illustrating a mutual capacitance configuration. In an alternative embodiment without an analog bus, each pin may instead be connected either to a circuit that generates a transmit (TX) signal or to an individual receive (RX) sensor circuit. The sense array 121 may include a multi-dimension capacitive sense array. The multi-dimension sense array includes multiple sense elements, organized as rows and columns. In another embodiment, the sense array 121 operates as an all-points-addressable ("APA") mutual capacitive sense array. The sense array 121 may be disposed to have a flat surface profile. Alternatively, the sense array 121 may have non-flat surface profiles. Alternatively, other configurations of capacitive sense arrays may be used. For example, instead of vertical columns and horizontal rows, the sense array 121 may have a hexagon arrangement, or the like. In one embodiment, the sense array 121 may be included in an indium tin oxide (ITO) panel or a touch screen panel. In one embodiment, sense array 121 is a capacitive sense array. In another embodiment, the sense array 121 is non-transparent capacitive sense array (e.g., PC touchpad).

In one embodiment, the capacitance-sensing circuit 101 may include a relaxation oscillator or other means to convert a capacitance into a measured value. The capacitance-sensing circuit 101 may also include a counter or timer to measure the oscillator output. The processing device 110 may further include software components to convert the count value (e.g., capacitance value) into a touch detection decision (also referred to as switch detection decision) or relative magnitude. It should be noted that there are various known methods for measuring capacitance, such as current versus voltage phase shift measurement, resistor-capacitor charge timing, capacitive bridge divider, charge transfer, successive approximation, sigma-delta modulators, charge-accumulation circuits, field effect, mutual capacitance, frequency shift, or other capacitance measurement algorithms. It should be noted however, instead of evaluating the raw counts relative to a threshold, the capacitance-sensing circuit 101 may be evaluating other measurements to determine the user interaction. For example, in the capacitance-sensing circuit 101 having a sigma-delta modulator, the capacitance-sensing circuit 101 is evaluating the ratio of pulse widths of the output (i.e., density domain), instead of the raw counts being over or under a certain threshold.

In another embodiment, the capacitance-sensing circuit 101 includes a TX signal generator to generate a TX signal (e.g., stimulus signal) to be applied to the TX electrode and a receiver (also referred to as a sensing channel), such as an integrator, coupled to measure an RX signal on the RX electrode. In a further embodiment, the capacitance-sensing circuit 101 includes an analog-to-digital converter (ADC) coupled to an output of the receiver to convert the measured RX signal to a digital value. The digital value can be further processed by the processing device 110, the host 150 or both.

The processing device 110 is configured to detect one or more touches on a touch-sensing device, such as the sense array 121. The processing device can detect conductive objects, such as touch objects 140 (fingers or passive styluses, an active stylus, or any combination thereof). The capacitance-sensing circuit 101 can measure a touch data on the sense array 121. The touch data may be represented as multiple cells, each cell representing an intersection of sense elements (e.g., electrodes) of the sense array 121. The capacitive sense elements are electrodes of conductive material, such as copper, silver, indium tin oxide (ITO), metal mesh, carbon nanotubes, or the like. The sense elements may also be part of an ITO panel. The capacitive sense elements can be used to allow the capacitance-sensing circuit 101 to measure self-capacitance, mutual capacitance, or any combination thereof. In another embodiment, the touch data measured by the capacitance-sensing circuit 101 can be processed by the processing device 110 to generate a 2D capacitive image of the capacitive-sense array 121. In one embodiment, when the capacitance-sensing circuit 101 measures mutual capacitance of the touch-sensing device (e.g., capacitive-sense array 121), the capacitance-sensing circuit 101 determines a 2D capacitive image of the touch-sensing object on the touch surface and processes the data for peaks and positional information. In another embodiment, the processing device 110 is a microcontroller that obtains a capacitance touch signal data set, such as from a sense array, and finger detection firmware executing on the microcontroller identifies data set areas that indicate touches, detects and processes peaks, calculates the coordinates, or any combination therefore. The firmware can calculate a precise coordinate for the resulting peaks. In one embodiment, the firmware can calculate the precise coordinates for the resulting peaks using a centroid algorithm, which calculates a centroid of the touch, the centroid being a center of mass of the touch. The centroid may be an X/Y coordinate of the touch. Alternatively, other coordinate interpolation algorithms may be used to determine the coordinates of the resulting peaks. The microcontroller can report the precise coordinates to a host processor, as well as other information.

In one embodiment, the processing device 110 further includes processing logic 102. Some or all of the operations of the processing logic 102 may be implemented in firmware, hardware, or software or some combination thereof. The processing logic 102 may receive signals from the capacitance-sensing circuit 101, and determine the state of the sense array 121, such as whether an object (e.g., a finger) is detected on or in proximity to the sense array 121 (e.g., determining the presence of the object), resolve where the object is on the sense array (e.g., determining the location of the object), tracking the motion of the object, or other information related to an object detected at the touch sensor. In another embodiment, processing logic 102 may include capacitance sensing circuit 101.

In another embodiment, instead of performing the operations of the processing logic 102 in the processing device 110, the processing device 110 may send the raw data or partially-processed data to the host 150. The host 150, as illustrated in FIG. 1, may include decision logic 151 that performs some or all of the operations of the processing logic 102. Operations of the decision logic 151 may be implemented in firmware, hardware, software, or a combination thereof. The host 150 may include a high-level Application Programming Interface (API) in applications 152 that perform routines on the received data, such as compensating for sensitivity differences, other compensation algorithms, baseline update routines, start-up and/or initialization routines, interpolation operations, or scaling operations. The operations described with respect to the processing logic 102 may be implemented in the decision logic 151, the applications 152, or in other hardware, software, and/or firmware external to the processing device 110. In some other embodiments, the processing device 110 is the host 150.

In another embodiment, the processing device 110 may also include a non-sensing actions block 103. This block 103 may be used to process and/or receive/transmit data to and from the host 150. For example, additional components may be implemented to operate with the processing device 110 along with the sense array 121 (e.g., keyboard, keypad, mouse, trackball, LEDs, displays, or other peripheral devices).

As illustrated, capacitance-sensing circuit 101 may be integrated into processing device 110. Capacitance-sensing circuit 101 may include an analog I/O for coupling to an external component, such as touch-sensor pad (not shown), sense array 121, touch-sensor slider (not shown), touch-sensor buttons (not shown), and/or other devices. The capacitance-sensing circuit 101 may be configurable to measure capacitance using mutual-capacitance sensing techniques, self-capacitance sensing technique, charge coupling techniques, combinations thereof, or the like. In one embodiment, capacitance-sensing circuit 101 operates using a charge accumulation circuit, a capacitance modulation circuit, or other capacitance sensing methods known by those skilled in the art. In an embodiment, the capacitance-sensing circuit 101 is of the Cypress TMA-3xx, TMA-4xx, or TMA-xx families of touch screen controllers. Alternatively, other capacitance-sensing circuits may be used. The mutual capacitive sense arrays, or touch screens, as described herein, may include a transparent, conductive sense array disposed on, in, or under either a visual display itself (e.g. LCD monitor), or a transparent substrate in front of the display. In an embodiment, the TX and RX electrodes are configured in rows and columns, respectively. It should be noted that the rows and columns of electrodes can be configured as TX or RX electrodes by the capacitance-sensing circuit 101 in any chosen combination. In one embodiment, the TX and RX electrodes of the sense array 121 are configurable to operate as TX and RX electrodes of a mutual capacitive sense array in a first mode to detect touch objects, and to operate as electrodes of a coupled-charge receiver in a second mode to detect a stylus on the same electrodes of the sense array. The stylus, which generates a stylus TX signal when activated, is used to couple charge to the capacitive sense array, instead of measuring a mutual capacitance at an intersection of an RX electrode and a TX electrode (including one or more sense element) as done during mutual-capacitance sensing. An intersection between two sense elements may be understood as a location at which one sense electrode crosses over or overlaps another, while maintaining galvanic isolation from each other. The capacitance associated with the intersection between a TX electrode and an RX electrode can be sensed by selecting every available combination of TX electrode and RX electrode. When a touch object (i.e., conductive object), such as a finger or stylus, approaches the sense array 121, the touch object causes a decrease in mutual capacitance between some of the TX/RX electrodes. In another embodiment, the presence of a finger increases the coupling capacitance of the electrodes. Thus, the location of the finger on the sense array 121 can be determined by identifying the RX electrode having a decreased coupling capacitance between the RX electrode and the TX electrode to which the TX signal was applied at the time the decreased capacitance was measured on the RX electrode. Therefore, by sequentially determining the capacitances associated with the intersection of electrodes, the locations of one or more inputs can be determined. It should be noted that the process can calibrate the sense elements (intersections of RX and TX electrodes) by determining baselines for the sense elements. It should also be noted that interpolation may be used to detect finger position at better resolutions than the row/column pitch as would be appreciated by one of ordinary skill in the art. In addition, various types of coordinate interpolation algorithms may be used to detect the center of the touch as would be appreciated by one of ordinary skill in the art.

It should also be noted that the embodiments described herein are not limited to having a configuration of a processing device coupled to a host, but may include a system that measures the capacitance on the sensing device and sends the raw data to a host computer where it is analyzed by an application. In effect, the processing that is done by processing device 110 may also be done in the host.

The processing device 110 may reside on a common carrier substrate such as, for example, an integrated circuit (IC) die substrate, or a multi-chip module substrate. Alternatively, the components of the processing device 110 may be one or more separate integrated circuits and/or discrete components. In one embodiment, the processing device 110 may be the Programmable System on a Chip (PSoC®) processing device, developed by Cypress Semiconductor Corporation, San Jose, Calif. Alternatively, the processing device 110 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or other programmable device. In an alternative embodiment, for example, the processing device 110 may be a network processor having multiple processors including a core unit and multiple micro-engines. Additionally, the processing device 110 may include any combination of general-purpose processing device(s) and special-purpose processing device(s).

Capacitance-sensing circuit 101 may be integrated into the IC of the processing device 110, or alternatively, in a separate IC. Alternatively, descriptions of capacitance-sensing circuit 101 may be generated and compiled for incorporation into other integrated circuits. For example, behavioral level code describing the capacitance-sensing circuit 101, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout may represent various levels of abstraction to describe capacitance-sensing circuit 101.

It should be noted that the components of electronic system 100 may include all the components described above. Alternatively, electronic system 100 may include some of the components described above.

In one embodiment, the electronic system 100 is used in a tablet computer. Alternatively, the electronic device may be used in other applications, such as a notebook computer, a mobile handset, a personal data assistant ("PDA"), a keyboard, a television, a remote control, a monitor, a handheld multi-media device, a handheld media (audio and/or video) player, a handheld gaming device, a signature input device for point of sale transactions, an eBook reader, global position system ("GPS") or a control panel, among others. The embodiments described herein are not limited to touch screens or touch-sensor pads for notebook implementations, but can be used in other capacitive sensing implementations, for example, the sensing device may be a touch-sensor slider (not shown) or touch-sensor buttons (e.g., capacitance sensing buttons). In one embodiment, these sensing devices include one or more capacitive sensors or other types of capacitance-sensing circuitry. The operations described herein are not limited to notebook pointer operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc.) handwriting recognition, and numeric keypad operation.

Figure 2:
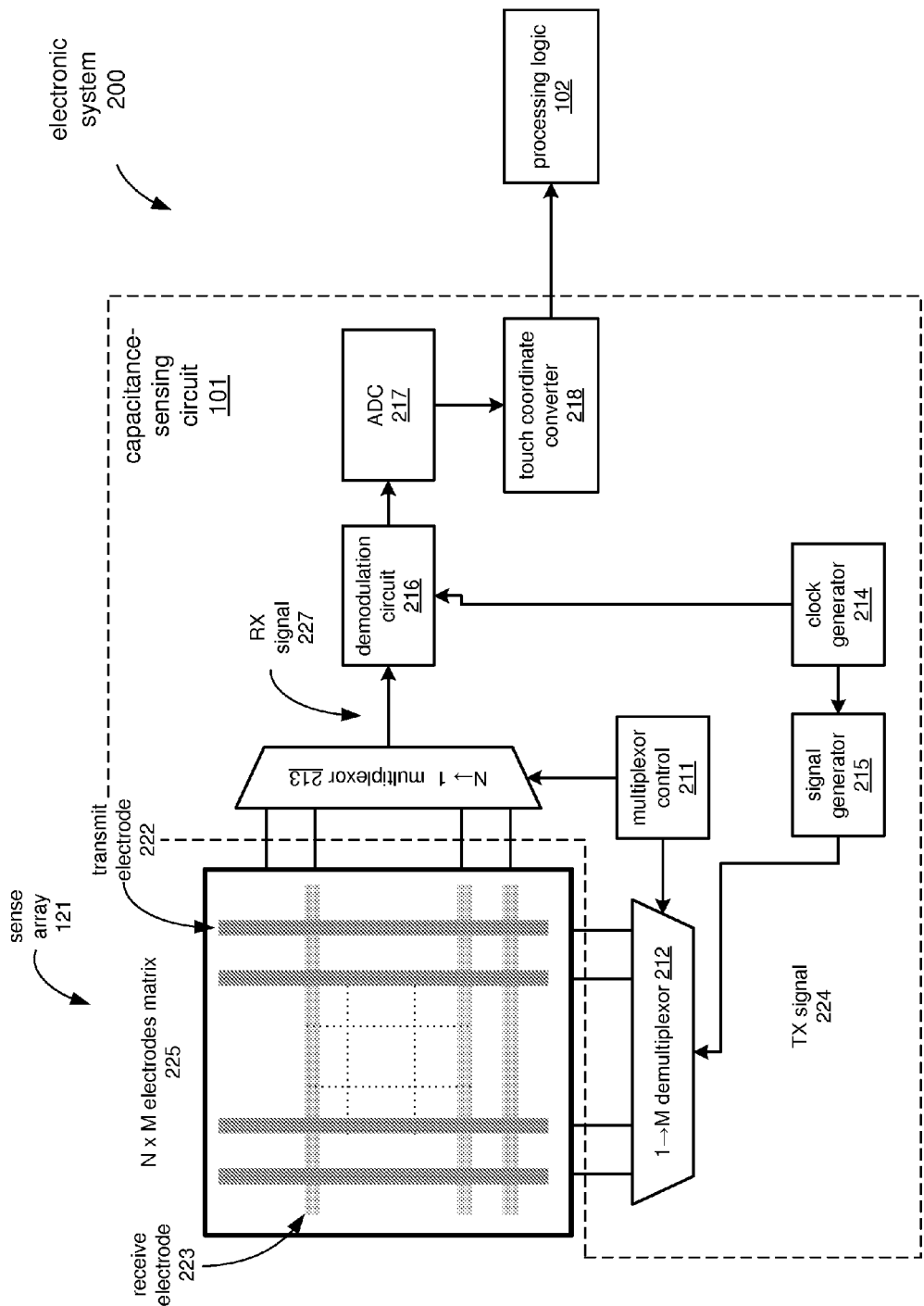
FIG. 2 is a block diagram illustrating an embodiment of an electronic system that processes touch data.

FIG. 2 is a block diagram illustrating an embodiment of an electronic system that processes touch data. Electronic system 200 includes sense array 121 composed of orthogonal electrodes and a capacitance-sensing circuit 101 that converts changes in measured capacitances to coordinates indicating the presence and location of touch. In one embodiment, the capacitance-sensing circuit 101 may measure mutual capacitances for intersections between transmit and receive electrodes in the sense array 121. The touch coordinates are calculated based on changes in the measured capacitances relative to the capacitances of sense array 121 in an un-touched state. Sense array 121 includes a matrix 225 of N×M electrodes (N receive electrodes and M transmit electrodes), which further includes transmit (TX) electrode 222 and receive (RX) electrode 223. Each of the electrodes in matrix 225 is connected with capacitance sensing circuit 101 through demultiplexer 212 and multiplexer 213.

Capacitance-sensing circuit 101 includes multiplexer control 211, demultiplexer 212, multiplexer 213, clock generator 214, signal generator 215, demodulation circuit 216, and analog to digital converter (ADC) 217. ADC 217 is further coupled with touch coordinate converter 218. Touch coordinate converter 218 may be implemented in the processing logic 102.

Transmit and receive electrodes in the electrode matrix 225 may be arranged so that each of the transmit electrodes overlap and cross each of the receive electrodes to form an array of intersections, while maintaining galvanic isolation from each other. Thus, each transmit electrode may be capacitively coupled with each of the receive electrodes. For example, transmit electrode 222 is capacitively coupled with receive electrode 223 at the point where transmit electrode 222 and receive electrode 223 overlap.

Clock generator 214 supplies a clock signal to signal generator 215, which produces a TX signal 224 to be supplied to the transmit electrodes of sense array 121. In one embodiment, the signal generator 215 includes a set of switches that operate according to the clock signal from clock generator 214. The switches may generate a TX signal 224 by periodically connecting the output of signal generator 215 to a first voltage and then to a second voltage, wherein the first and second voltages are different.

The output of signal generator 215 is connected with demultiplexer 212, which allows the TX signal 224 to be applied to any of the M transmit electrodes of sense array 121. In one embodiment, multiplexer control 211 controls demultiplexer 212 so that the TX signal 224 is applied to each transmit electrode 222 in a controlled sequence. Demultiplexer 212 may also be used to ground, float, or connect an alternate signal to the other transmit electrodes to which the TX signal 224 is not currently being applied. In an alternate embodiment the TX signal 224 may be presented in a true form to a subset of the transmit electrodes 222 and in complement form to a second subset of the transmit electrodes 222, wherein there is no overlap in members of the first and second subset of transmit electrodes 222.

Because of the capacitive coupling between transmit and receive electrodes, the TX signal 224 applied to each transmit electrode induces a current within each of the receive electrodes. For instance, when the TX signal 224 is applied to transmit electrode 222 through demultiplexer 212, the TX signal 224 induces an RX signal 227 on the receive electrodes in matrix 225. The RX signal 227 on each of the receive electrodes can then be measured in sequence by using multiplexer 213 to connect each of the N receive electrodes to demodulation circuit 216 in sequence.

The mutual capacitance associated with the intersections of all TX electrodes and RX electrodes can be measured by selecting every available combination of TX electrode and RX electrode using demultiplexer 212 and multiplexer 213. To improve performance, multiplexer 213 may also be segmented to allow more than one of the receive electrodes in matrix 225 to be routed to additional demodulation circuits, such as demodulation circuit 216. In an optimized configuration, where there is a 1-to-1 correspondence of instances of demodulation circuit 216 with receive electrodes, multiplexer 213 may not be present in the system.

When a conductive object, such as a finger, approaches the electrode matrix 225, the conductive object causes a decrease in the measured mutual capacitance between only some of the electrodes. For example, if a finger is placed near the intersection of transmit electrode 222 and receive electrode 223, the presence of the finger will decrease the charge coupled between electrodes 222 and 223. Thus, the location of the finger on the touchpad can be determined by identifying the one or more receive electrodes having a decrease in measured mutual capacitance in addition to identifying the transmit electrode to which the TX signal 224 was applied at the time the decrease in capacitance was measured on the one or more receive electrodes.

By determining changes in the mutual capacitances associated with each intersection of electrodes in the matrix 225, the presence and locations of one or more conductive objects may be determined. The determination may be sequential, in parallel, or may occur more frequently at commonly used electrodes.

In alternative embodiments, other methods for detecting the presence of a finger or other conductive object may be used where the finger or conductive object causes an increase in measured capacitance at one or more electrodes, which may be arranged in a grid or other pattern. For example, a finger placed near an electrode of a capacitive sensor may introduce an additional capacitance to ground that increases the total capacitance between the electrode and ground. The location of the finger can be determined based on the locations of one or more electrodes at which a change in measured capacitance is detected, and the associated magnitude of capacitance change at each respective electrode.

The induced current signal is integrated by demodulation circuit 216. The rectified current output by demodulation circuit 216 can then be filtered and converted to a digital code by ADC 217.

A series of such digital codes measured from adjacent sensor intersections, when compared to or offset by the associated codes of these same sensors in an un-touched state, may be converted to touch coordinates indicating a position of a touch on sense array 121 by touch coordinate converter 218. The touch coordinates may then be used to detect gestures or perform other functions by the processing logic 102.

Figure 3:
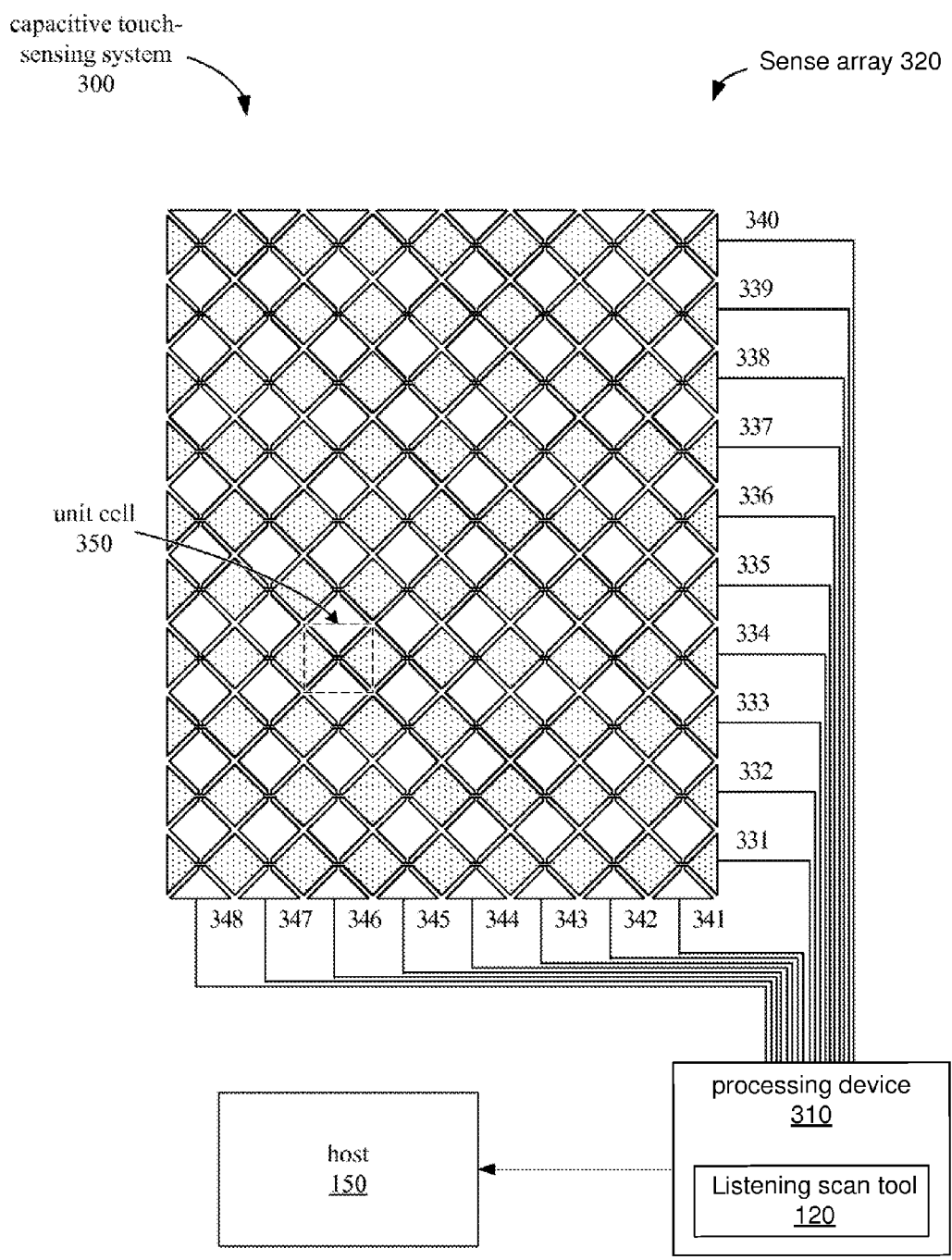
FIG. 3 illustrates an embodiment of a capacitive-sense touch-sensing system according to one embodiment.

FIG. 3 illustrates an embodiment of a capacitive-sense touch-sensing system according to one embodiment. Capacitive touch-sensing system 300 includes a sense array 320. Sense array 320 may be a capacitive-sense array. Sense array 320 includes multiple row electrodes 331-340 and multiple column electrodes 341-348. The row and column electrodes 331-348 are connected to a processing device 310, which may include the functionality of capacitance-sensing circuit 101, as illustrated in FIG. 1 or 2. In one embodiment, the processing device 310 may perform mutual capacitance measurement scans of the sense array 320 to measure a mutual capacitance value associated with each of the intersections between a row electrode and a column electrode in the sense array 320. The measured capacitances may be further processed to determine centroid locations of one or more contacts of conductive objects proximate to the sense array 320.

In one embodiment, the processing device 310 is connected to a host 150 which may receive the measured capacitances or calculated centroid locations from the processing device 310.

The sense array 320 illustrated in FIG. 3 includes electrodes arranged to create a pattern of interconnected diamond shapes. Specifically, the electrodes 331-348 of sense array 320 form a single solid diamond (SSD) pattern. In one embodiment, each intersection between a row electrode and a column electrode defines a unit cell. Each point within the unit cell is closer to the associated intersection than to any other intersection. For example, unit cell 350 contains the points that are closest to the intersection between row electrode 334 and column electrode 346.

In one embodiment, capacitive touch-sensing system 300 may collect data from the entire touch-sensing surface of sense array 320 by performing a scan to measure capacitances of the unit cells that comprise the touch-sensing surface, then process the touch data serially or in parallel with a subsequent scan. For example, one system that processes touch data serially may collect raw capacitance data from each unit cell of the entire touch-sensing surface, and filter the raw data. Based on the filtered raw data, the system may determine local maxima (corresponding to local maximum changes in capacitance) to calculate positions of fingers or other conductive objects, then perform post processing of the resolved positions to report locations of the conductive objects, or to perform other functions such as motion tracking or gesture recognition.

In one embodiment, capacitive touch-sensing system 300 may be configured to perform one or both of self-capacitance sensing and mutual capacitance sensing. In one embodiment, capacitive touch-sensing system 300 is configured to perform self-capacitance sensing, in sequence or in parallel, to measure the self-capacitance of each row and column electrode of the touch-sensing surface (e.g., sense array 320), such that the total number of sense operations is N+M, for a capacitive-sense array having N rows and M columns. In one embodiment, capacitive touch-sensing system 300 may be capable of connecting individual electrodes together to be sensed in parallel with a single operation. For example, multiple row (e.g., electrodes 331-340) and or column electrodes (e.g., electrodes 341-348) may be coupled together and sensed in a single operation to determine whether a conductive object is touching or near the touch-sensing surface. In an alternate embodiment, the capacitive touch-sensing system 300 may be capable of connecting each row electrode to it is own sensing circuit such that all row electrodes may be sensed in parallel with a single operation. The capacitive touch-sensing system 300 may also be capable of connecting each column electrode to its own sensing circuit such that all column electrodes may be sensed in parallel with a single operation. The capacitive touch-sensing system 300 may also be capable of connecting all row and column electrodes to their own sensing circuits, such that all row and column electrodes may be sensed in parallel with a single operation.

In one embodiment, the capacitive touch-sensing system 300 may perform mutual capacitance sensing of the touch-sensing surface (e.g., sense array 320) by individually sensing each intersection between a row electrode and a column electrode. Thus, a total number of sense operations for a capacitive-sense array (e.g., sense array 320) having X rows and Y columns is X×Y. In one embodiment, performing a mutual capacitance measurement of a unit cell formed at the intersection of a row electrode and a column electrode includes applying a signal (TX) to one electrode and measuring characteristics of the signal on another electrode resulting from the capacitive coupling between the electrodes.

In one embodiment, multiple capacitance sensing circuits may be used in parallel to measure a signal coupled to multiple column electrodes simultaneously, from a signal applied to one or more row electrodes. In one embodiment, for a capacitive-sense array (e.g., sense array 320) having X rows, Y columns, and N columns that can be sensed simultaneously, the number of mutual capacitance sensing operations is the smallest whole number greater than or equal to X×Y/N.

In one embodiment, each update of the touch locations may include a sensing portion and a non-sensing portion. The sensing portion may include measurement of capacitance associated with intersections between electrodes, while the non-sensing portion may include calculation of touch locations based on the capacitance measurements and reporting of the calculated touch locations to a host device.

Figure 4:
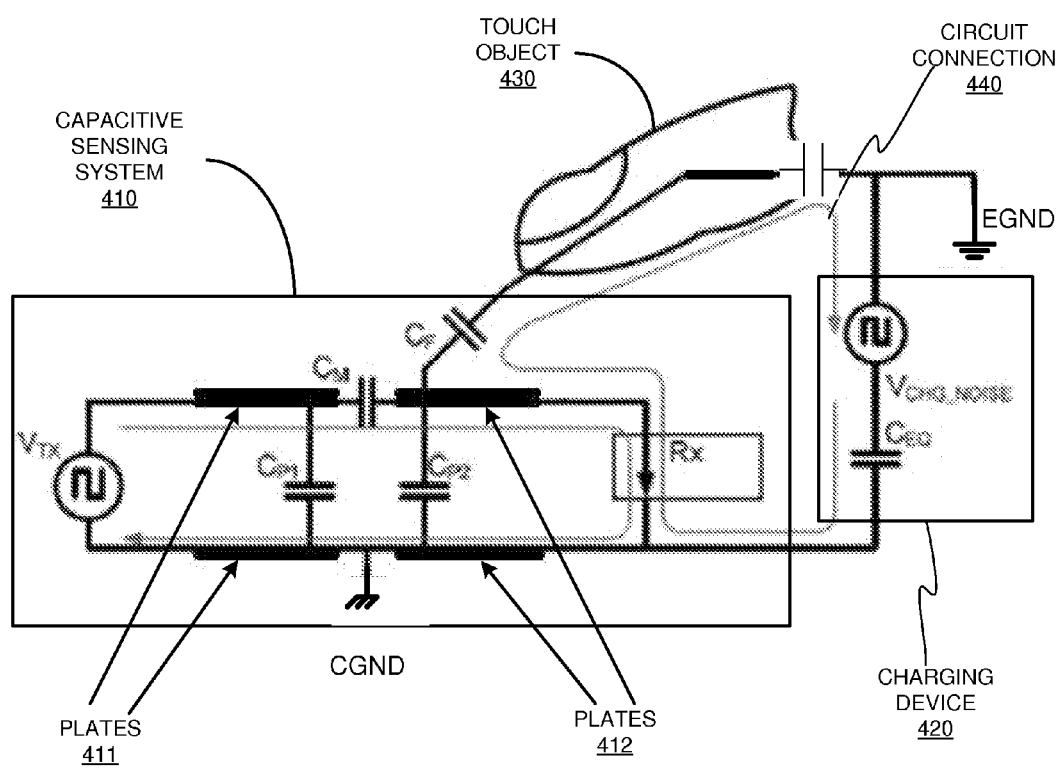
FIG. 4 illustrates a capacitive sensing system coupled to a noise source, according to one embodiment.

FIG. 4 illustrates a capacitive sensing system coupled to a noise source, according to one embodiment. Capacitive sensing system 410 is coupled to a noise source, for example, charging device 420. In another embodiment, the noise source may be an LCD display (not shown) or other noise source. Capacitive sensing system 410 comprises plates 411 and plates 412, which may be metal or some other material. When a touch object 430 (i.e., conductive object, e.g., a finger) is placed in proximity to one of the plates 411 and 412, there is an effective capacitance, $C_F$, between the plate and the touch object 430 with respect to ground. Also, there is a capacitance, $C_M$, between the plates 411 and 412. Accordingly, a processing device, such as processing device 110 in FIG. 1, can measure the change in capacitance, capacitance variation $C_M$, when the touch object is in proximity to one or more of the plates 411 and 412. In one embodiment, a dielectric material may be positioned above and below the plates 411 and 412 which are closest to the touch object 430. The dielectric material may be an overlay. The overlay may be non-conductive material used to protect the circuitry from environmental elements and to insulate the touch object 430 or other substance from the circuitry. FIG. 4, by way of example, illustrates a finger to represent touch object 430, however in alternative embodiments, touch object 430 may be any conductive object or substance.

In one embodiment, the charging device 420 may be used to power the capacitive sensing system 410 and/or to charge a battery or other power source coupled to the capacitive sensing system 410. Charging device 420 may generate common mode voltage noise. When the touch object 430 comes into contact with capacitive sensing system 410, the touch object 430 may complete a circuit connection 440 between the charging device 420 and the capacitive sensing system 410. By completing the circuit connection 440, noise generated by charging device 420 is introduced into the capacitive sensing system 410. The noise caused by the contact between the touch object 430 and the capacitive sensing system 410 may include direct coupled noise.

In one embodiment, in a touch sensor system (e.g., electronic system 100 in FIG. 1, electronic system 200 in FIG. 2, and capacitive sensing system 410), external sources of noise, often produced by low quality battery chargers, cause noise currents to be coupled from a user's finger to the touch system sensor. The noise current corrupts measurements made by the system and can result in large errors in the computed finger positions, false touches and suppression of the signal produced by real touches such that they are not reported.

Figure 5:
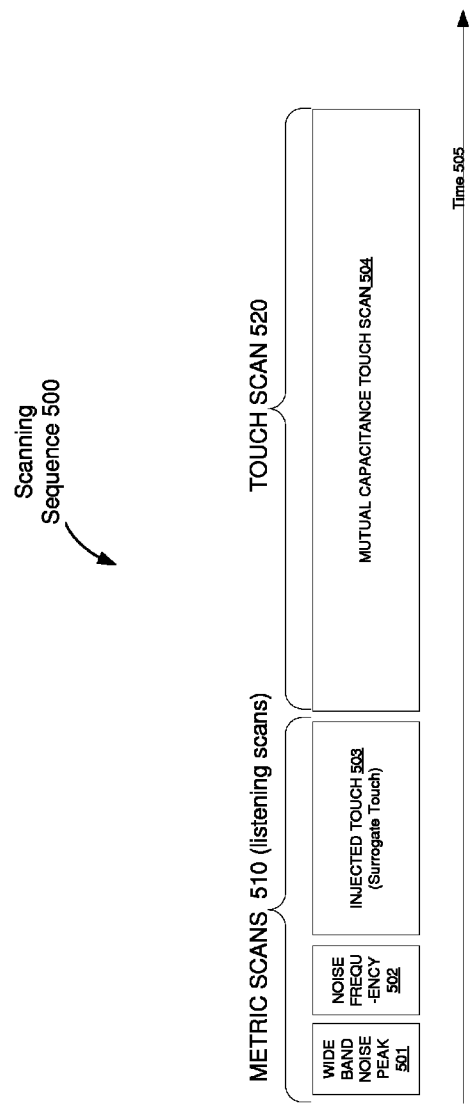
FIG. 5 is an illustration of a scanning sequence, according to one embodiment.

FIG. 5 is an illustration of a scanning sequence, according to one embodiment. Scanning sequence 500 can be described as including two types of scans, metric scans 510 (a.k.a., listening scan) and touch scan 520, and may be performed in a temporal order as described by time 505. For example, metric scans 510 may be performed prior to conducting touch scan 520. However, it should be noted that scanning sequence 500 is illustrative and metric scans 510 and touch scan 520 may be performed in any order and may include one or more metric scans and or touch scans. Metric scans 510 may be performed to measure noise, while the touch scan 520 may collect touch data indicative of a touch detected proximate a sense array (e.g., sense array 121 in FIG. 1). In one embodiment, processing logic 102 and/or listening scan tool 120 may perform the scanning sequence 500.

Injected touch 503 may produce similar data as would be present during a touch scan of the sense array with a conductive object at a known location on the sense array (e.g., sense array 121). For example, metric testing is typically performed using a metal finger (e.g., conductive object) to conduct noise onto the panel (e.g., sense array 121) at a known position. The metal finger may also be present absent a noise signal, creating what can be called a "gold standard" of touch data for the physical position of a touch. Both the metric test and the "gold standard" may be performed to determine the presence of a touch and the X-Y coordinate position of the touch. The sensing system (e.g., electronic system 100 and electronic system 200) may then compare the "gold standard" with the metric testing data, to determine error in the sensing system due to noise. If a test metal finger were on the panel at all times, the magnitude of error in the sensing system when determining presence and position would provide a perfect noise metric. However, it is not practical to continually position a physical test finger on the touch screen (e.g., sense array 121) during normal user operation. It is possible to electrically emulate the effect of a test finger in the sensing system (e.g., electronic system 100 and electronic system 200), for example, with injected touch 503.

In a capacitive sensing system (e.g., electronic system 100 and 200), noise is typically measured using separate metric scans (a.k.a., listening scan) when the TX signal is disabled. Metric scans 510 may be performed sequentially. In one embodiment, the separate metric scans such as wide band noise peak 501, noise frequency 502, and injected touch 503, may be performed in any order. In another embodiment, the separate metric scans may be performed simultaneously. In another embodiment, any of the separate metric scans may or may not be performed and additional separate metric scans may or may not be included in metric scans 510. In another embodiment, the injected touch 503 may be run multiple times prior to or after touch scan 520. The separate metric scans of metric scans 510 may be performed so that touch data from an actual touch is not confused with noise. In one embodiment, metric scans 510 are performed independent of a transmitted stimulus signal (e.g., TX signal 224). Said differently, during the metric scans 510, the transmit signal is turned off, so that no touch signal is present from a touch object. In another embodiment, injected touch 503, in particular, is performed independent of a transmitted stimulus signal (e.g., TX signal 224).

In one embodiment, injected touch 503, induces a surrogate touch current in hardware (e.g., capacitance sensing circuit 101) to produce the same measured values during the injected touch 503 scan as would be present during a touch scan 520 with a conductive object disposed at a known location (e.g., the metal test finger described above) on the sense array (e.g., sense array 121). The sensing system (e.g., electronic system 100 and electronic system 200) may then use the data collected from the metric scans 510 generally, and the injected touch 503 in particular, to compute an estimate of a noise metric. In one embodiment, a noise metric may be an estimate of error (e.g., position error and or jitter) that will be present in a touch measurement due to noise in the sensing system. In another embodiment, a noise metric may be directly related to customer observable performance measures such as false touches, dropped touches, and X-Y coordinate finger position jitter.

FIG. 6 is an example of cells in a sense array, according to one embodiment. In one embodiment, cells of sense array 600 represent an intersection of sense elements (e.g., electrodes) of the sense array 121. In one embodiment, processing logic (e.g., processing logic 102) is configured to detect one or more touches on capacitive sense array 121. The one or more touches produces touch data on the capacitive sense array 121, and the processing logic measures the touch data. The touch data may be represented as multiple cells (e.g., cells of sense array 600), each cell (e.g., $S_{0x}$-$S_{8x}$) representing an intersection of sense elements of capacitive sense array 121. In FIG. 6, cells marked $S_{0x}$-$S_{8x}$ represent names identifying cells. In one embodiment, the names $S_{00}$-$S_{88}$ represent locations of cells corresponding to sense array 121. In one embodiment, one or more touches on a sense array 121 produce touch data on cells 600 and the touch data can be represented as counts (not shown).

In one embodiment, injected touch 503 is performed on a known location on a sense array (e.g., sense array 600). In order to determine the known location, processing logic (e.g., processing logic 120) may determine the presence or location of a touch object. For example, processing logic may detect a touch object on a particular row or column of sense array 600. In another embodiment, processing logic may determine that a touch is present on a particular cell or number of cells on sense array 600. After determining the known location, injected touch 503 may be performed at a precise location on sense array 600 while a conductive object is conducting noise on to the sense array 600.

In another embodiment, injected touch 503 may simulate a touch on any size matrix of cells. For example, in FIG. 6, injected touch 601 may simulate a touch on a 2×2 sized matrix (e.g., $S_{44}$, $S_{54}$, $S_{45}$, $S_{55}$). As a result of injected touch 601, the cells $S_{44}$, $S_{54}$, $S_{45}$, $S_{55}$, may receive touch data indicative of a touch. For example cells $S_{44}$, $S_{54}$, $S_{45}$, and $S_{55}$, may have counts of 23, 29, 30, 34, respectively while the remaining cells may have counts of approximately zero. Performing an injected touch, such as injected touch 601 will be discussed in the FIGS. 7 and 8.

Figure 7:
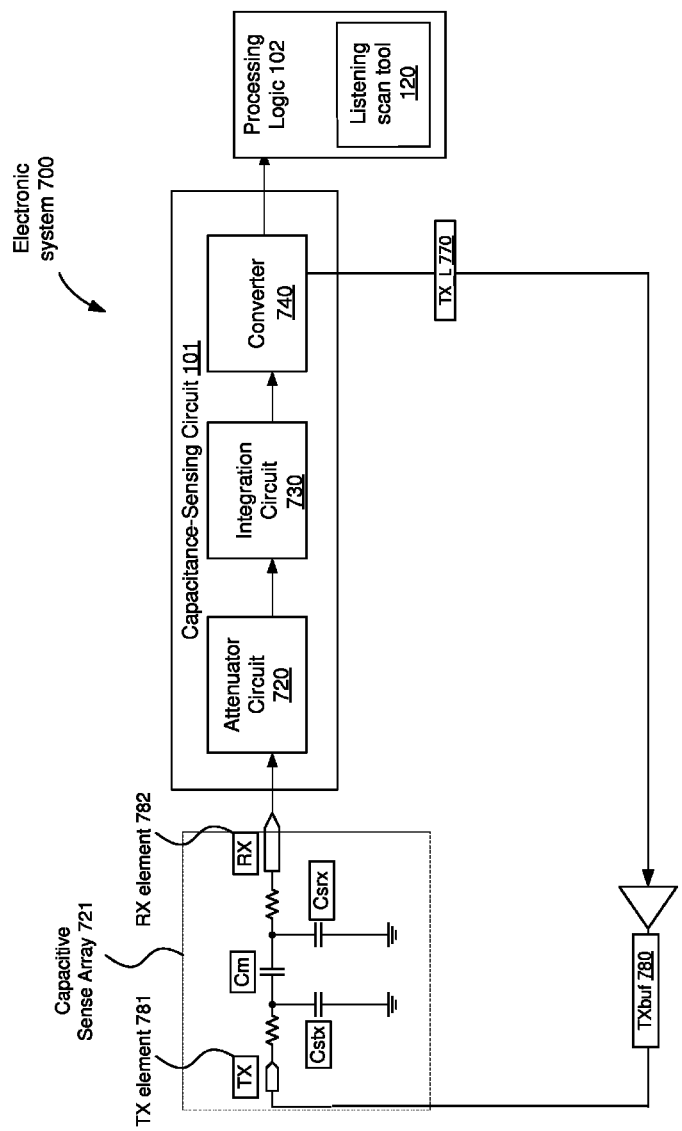
FIG. 7 is a block diagram illustrating another embodiment of an electronic system that processes touch data.

FIG. 7 is a block diagram illustrating another embodiment of an electronic system that processes touch data. The capacitance-sensing circuit 101 includes an attenuator circuit 720, an integrator circuit 730, and a converter 740. Capacitance-sensing circuit 101 is coupled to processing logic 102 (which includes listening scan tool 120) and capacitive sense array 721. In one embodiment, capacitance-sensing circuit 101 controls the transmitted stimulus signal (e.g., TX_L 770) through a unity gain buffer (e.g., TXbuf 780). The capacitance-sensing circuit 101 may be part of a touchscreen controller coupled to an indium-tin-oxide (ITO) panel. The touch screen controller measures input current from the capacitive sense array 721 and based on this data, calculates the touch position. The signals received from the capacitive sense array 721 can be attenuated by the attenuator circuit 720 before being input into the integration circuit 730. The integration circuit 730 integrates the attenuated signal and inputs the resulting signal into the converter 740. The converter 740 converts the integrated signal into a digital value and sends the digital value to processing logic 102. Alternatively, the digital value can be processed further by a processing device (e.g., processing device 110) or a host (e.g., host 150). The digital value represents a capacitance measured on the capacitive sense array 721 for purposes of detecting touches on capacitive sense array 721 by one or more conductive objects, as well as positions of the touches, gestures by conductive objects, or the like.

In one embodiment, during touch scan 520, the TX sensor elements (e.g., TX element 781) are driven so that a charge is received in each RX channel (e.g., RX element 782 may be the input to the RX channel). During touch scan 520, a baseline charge is removed using a current output digital-to-analog converter (IDAC) (not shown), leaving only charge variation due to the finger touch modulation of the TX signal (e.g., TX_L 770) on the integration capacitors of integration circuit 730.

In one embodiment, during injected touch 503, a transmitted stimulus signal (e.g., TX signal such as TX_L 770) is not present, thus the IDAC is not used. During injected touch 503, there is no baseline current for the IDAC to remove. Therefore, the IDAC is available to emulate a surrogate touch by adding an amount of charge that would have been produced by a metal test finger as described in FIG. 5. The IDAC charge may be set uniquely for each RX channel and each injected touch 503 scan. Additionally, an injected touch 503 may be injected anywhere on sense array 121, as described in FIG. 6. Since the injected touch 503 is produced by adding charge to the integration capacitors of integration circuit 730, the effect of noise saturating the RX channel is included in the measurement of injected touch 503. Thus, large noise signals saturating integration circuit 730 during injected touch 503 scan will destroy the surrogate touch signal, while dropped touches will be manifested exactly as they would be for a physical touch on the sense array 721.

It should be noted that an injected touch 503 need not be generated by an IDAC or current source/sink. Injected touch 503 may be generated digitally, for example, by adding a fixed touch difference count value in firmware. In another embodiment, an injected touch 503 may be generated by connecting a capacitive test structure (not shown) via a multiplexor (e.g., multiplexor 213) to the receiving circuit. In another embodiment, an injected touch 503 may be generated by adding a fixed constant to the listening data. In this case, the IDAC and TX signal are turned off. The listening scan will consist of only noise. The fixed constant value, which may emulate a real touch, is added to the listening data. In another embodiment, and injected touch 503 may be generated by initializing a voltage representative of a touch value on an integration circuit such as integration circuit 730. In another embodiment, the TX signal is routed through a mock circuit element connected in parallel to the Rx input.

The following methods (method 800, 900, 1000, 1100, 1400 1500, 1600, 1700, and 1710) may be performed by processing logic (e.g., processing logic 102) that may include hardware (circuitry, dedicated logic, etc.), software (such as is run on a general purpose computing system or a dedicated machine), firmware (embedded software), or any combination thereof. In one embodiment, the processing device 110 performs some or all of each method disclosed above. In another embodiment, listening scan tool 120 performs some or all of each method. In another embodiment, the host 150 performs some or all of the operations each method. Alternatively, other components of the electronic system 100 or electronic system 200 perform some or all of the operations of each method.

Figure 8:
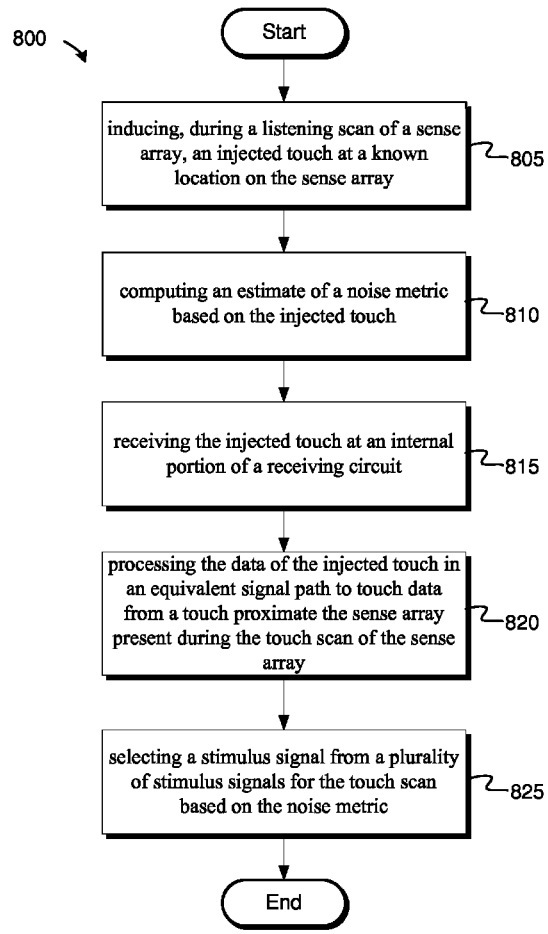
FIG. 8 is a flowchart of a method illustrating detection of a touch, according to one embodiment.

FIG. 8 is a flowchart of a method illustrating detection of a touch, according to one embodiment. Method 800 begins at block 805 where processing logic (e.g., processing logic 102) induces, during a listening scan (e.g., metric scans 510), an injected touch (e.g., injected touch 503) to produce similar data as would be present during a touch scan of the sense array (e.g., sense array 121) with a conductive object being disposed at a known location on the sense array. For example, processing logic may determine the presence a location of a conductive object such as a finger. The location of the finger may be determined from a metric scan 510 or a touch scan 520. In one embodiment, the known location includes a plurality of cells of the sense array (e.g., injected touch 601) where a touch detected proximate the sense array occurs. For example, once a known location of the finger has been determined, injected touch 601 may produce a surrogate touch at the multiple cells of sense array 600 as described in FIG. 6.

In one embodiment, the listening scan (e.g., metric scans 510) is performed independent of a transmitted stimulus signal. For example, in FIG. 7, the transmission signal (i.e., TX_L 770) may be turned off when performing a listening scan. Additionally, the absence of a transmission signal removes a touch object's (e.g., finger) influence from the results of the listening scan (e.g., listening data).

In block 810 of method 800, processing logic (e.g., processing logic 102) computes, using the data from the injected touch 503, an estimate of a noise metric based on the touch. In one embodiment, a noise metric describes characteristics of detected noise. For example, a noise metric may describe the external noise amplitude. In another embodiment, the noise metric may describe the frequency at which the noise exists. In another embodiment, the noise metric may describe the frequency and amplitude of the noise. In another embodiment, the noise metric may describe the location of a touch object on the sense array.

In another embodiment, the listening scan (e.g., metric scans 510) is performed for a plurality of frequencies. For example, multiple listen scans may be performed sequentially at different listen frequencies. A single channel (e.g., RX element 782) may be used to scan multiple frequencies sequentially. In one embodiment, processing logic generates a noise metric for each of the plurality of frequencies. If the noise metric for a particular frequency is high, it means that noise exists at that particular listen frequency. Conversely, if the noise metric for a particular frequency is low, it means that low noise or no noise exists at that particular listen frequency. A separate noise metric may be computed for each different listen frequency. In one embodiment, the noise metric with minimum noise out of the multiple noise metrics for each different listen frequency is said to have a minimum noise response. In another embodiment, the noise metric indicating the minimum detected noise is the minimum noise metric, which may be frequency based, magnitude based, or other alternative.

In another embodiment, the listen scan (e.g., metric scans 510) is performed for a plurality of frequencies in parallel. An electronic system (e.g., electronic system 100 and electronic system 200) may include multiple channels (e.g., see FIG. 2 with multiple RX channels and multiple TX channels). The multiple channels (e.g. RX channels) may be configured to perform a listen scan on multiple frequencies in parallel and simultaneously. Processing logic (e.g., processing logic 102) may compute a noise metric for each frequency of the listen frequency.

In block 815 of method 800, processing logic (e.g., processing logic 102) receives the injected touch 503 at an internal portion of the receiving circuit. As described in FIG. 5, a metric test may be performed using a metal test finger to conduct noise onto sense array 121. Placing a metal test finger on sense array 121 during customer use is impractical. Therefore, in one embodiment, injected touch 503 is performed at an internal portion of the receiving circuit, such as capacitance-sensing circuit 101. In one embodiment, the injected touch 503 may be performed by an IDAC located in processing device 110. The IDAC may deliver current to the integrating capacitors of integration circuit 730 to simulate a surrogate touch. In another embodiment, an injected touch 503 may be introduced by adding a fixed touch difference count in firmware.

In block 820 of method 800, processing logic process (e.g., processing logic 102) the data of the injected touch 503 in an equivalent signal path to touch data from a touch proximate the sense array (e.g., sense array 121) present during the touch scan of the sense array. Processing data from injected touch 503 in an equivalent signal path to touch data from a touch allows for a more precise estimate of noise, in part, because the data from injected touch 503 will be conditioned by the same circuitry as would an actual touch. Thus, the data from injected touch 503 will be affected in a similar manner as data from an actual touch. For example, data from an injected touch 503 that is processed in an equivalent signal path to touch data from a touch may be processed by downstream filters and incorporate the signal conditioning caused by the downstream filters. In one embodiment, the equivalent signal path is the same or similar signal path in which data of an actual touch is processed. In another embodiment, the equivalent signal path may be the same signal path for both data of injected touch 503 and an actual touch, except that the starting point is different. For example, in FIG. 7 injected touch 503 may begin in integration circuit 730 while touch data may begin at or received by the receiving circuit at attenuator circuit 720. However, both the data of the injected touch 503 and the actual touch are processed in an equivalent signal path starting from integration circuit 730.

In block 825 of method 800, processing logic (e.g., processing logic 102) selects a stimulus signal (e.g., selected stimulus signal) from a plurality of stimulus signals (e.g., TX signal such as TX_L 770) for the touch scan (e.g., touch scan 520), where the touch scan measures the touch proximate the sense array (e.g., sense array 121), according to one embodiment. The selection of the stimulus signal may be based on the noise metric, where the noise metric is indicative of noise characteristics of noise on the sense array (e.g., sense array 121). For example, as described in block 810 of method 800, a noise metric may be computed for different frequencies of noise. Processing logic may determine from multiple metric scans (e.g., metric scans 510) which frequency has a minimum noise response based on the computed noise metrics. Processing logic may select the frequency that has minimum noise response and choose that frequency to transmit a stimulus signal for a touch scan (e.g., touch scan 520). Additional embodiments describing the selection of a stimulus signal based on the noise metric will be discussed below.

Figure 9:
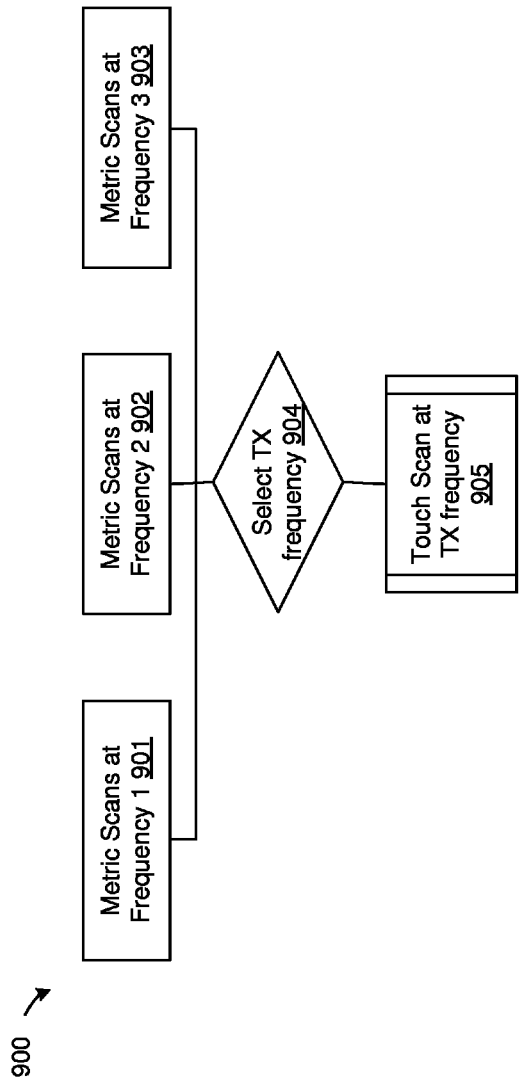
FIG. 9 is a flowchart of a method illustrating frequency hopping, according to one embodiment.

FIG. 9 is a flowchart of a method illustrating frequency hopping, according to one embodiment. Method 900 begins at block 901, where processing logic (e.g., processing logic 102) performs a listening scan (e.g., metric scan 510) at a selected frequency. In one embodiment, the listening scan includes injected touch 503. In block 902 of method 900, processing logic performs a listening scan at a second selected frequency. In block 903 of method 900, processing logic performs a listening scan at a third selected frequency. The listening scan at each frequency may be performed sequentially or in parallel as discussed in FIG. 8. The listening scan is performed without a TX signal (e.g., TX_L 770) in order to determine the external noise level. Each listening scan produces a noise metric which indicates characteristics of the detected noise. Method 900 continuous to block 904, where processing logic selects a TX frequency (i.e., frequency of a transmitted stimulus signal). In one embodiment, the frequency with the minimum noise metric or minimum noise response may be selected as the TX frequency. Method 900 continues to block 905 where processing logic uses the selected TX frequency to perform a touch scan (e.g., touch scan 520). In another embodiment, the number of frequencies for with a listening scan is performed may be any number. For example, a touch scan for a single frequency may be performed or a multiple touch scans for more than three frequencies may be performed. For purposes of illustration, a separate listening scan may be performed for four frequencies: 100 kHz, 150 kHz, 250 kHz, and 350 kHz. Processing logic may store one or multiple noise metrics for each frequency. For example, processing logic may store a wide band noise metric for wide band noise peak 501 and a noise metric for listening scan, both for a single frequency. It should be noted that the details of the above disclosure may be incorporated in method 900, in particular the details presented in the description of FIG. 8.

In one embodiment, the listening scan (e.g., metric scans 510) is performed with multiple frequencies in parallel instead of sequentially. Performing multiple listening scans in parallel for different frequencies reduces the window of time between the listen scan on each frequency and the touch scan (e.g., touch scan 520). Performing a listening scan for multiple frequencies in parallel reduces the probability that the frequency of noise changes during the scanning sequence (e.g., scanning sequence 500). Typically, the listening scan (e.g., metric scans 510) and touch scan (e.g., touch scan 520) execute very fast and the external noise sources and the associated noise characteristics remain relatively constant. For example, if the external noise frequency changes slowly, the optimal transmission frequency for a touch scan is selected based on current and previously measured data. But if external noise changes nearly instantaneously after the listen scan but before the touch scan, processing logic (e.g., processing logic 120) may select an incorrect transmission frequency (e.g., TX_L 770) because the noise metrics are outdated. In other words, if external noise frequency changes just before the touch scan, the listening scan will not detect the correct noise characteristics. As a result, undetected noise may potentially cause touch jitter or false touch. Scanning multiple frequencies simultaneously during the listening scan reduces the window of time between the listen scan on each frequency and the touch scan, which reduces the probability of measurement error for a touch in an environment where the noise frequencies change quickly.

Figure 10:
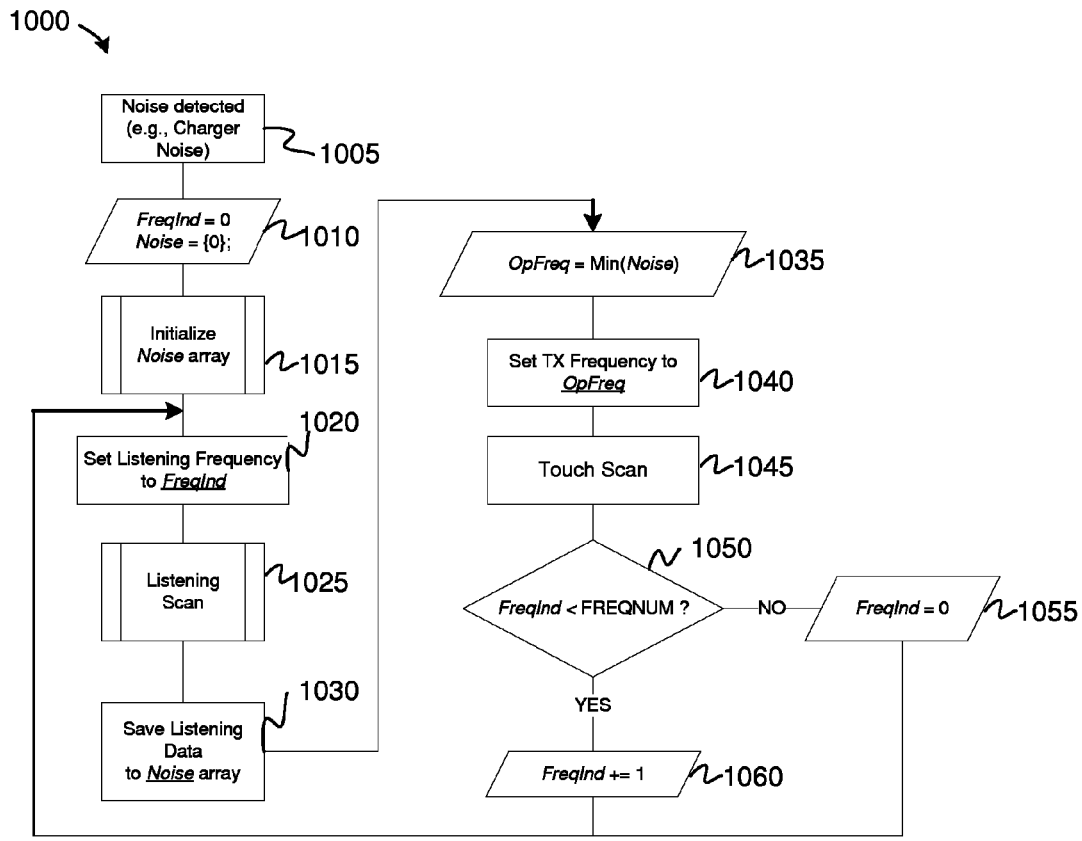
FIG. 10 is a flowchart of a method illustrating auto frequency hopping (AFH), according to one embodiment.

FIG. 10 is a flowchart of a method illustrating auto frequency hopping (AFH), according to one embodiment. Method 1000 presents one embodiment in which one listening scan (e.g., metric scans 510) is performed before the touch scan (e.g., touch scan 520). After each loop cycle in method 1000, the listening scan's operational frequency changes. In method 1000, the transmission frequency (i.e., TX frequency) for a touch scan is selected by a minimum noise criteria from the noise data or noise metrics obtained during the listening scans. Method 1000 may be executed when noise is detected. In one embodiment the AFH method described in method 1000 executes if charger noise is detected by a Wideband Noise Metric (e.g., wideband noise peak 501). The Wideband Noise Metric is a special noise metric that indicates an external noise amplitude and is not frequency dependent.

Method 1000 begins at block 1005 where processing logic detects noise. In one embodiment, processing logic detects charger noise. In another embodiment, processing logic detects noise from another source, such as LCD noise. In block 1010 of method 1000, processing logic provides the variable FreqInd with a value of zero and variable, Noise with a value (e.g., Noise={0}) that corresponds to FreqInd=0. FreqInd refers to a frequency index. FreqInd may be a pointer to an array of operational frequencies. For example, there may be 4 operational frequencies: 100 kHz, 150 kHz, 250 kHz, and 350 kHz. Corresponding to the 4 operational frequencies, FreqInd may have a value of 0 to 3. FreqInd=0 may refer to 100 kHz and FreqInd=3 may refer to 350 kHz. Noise may refer to an array that stores listening scan data corresponding to each of the operational frequencies of FreqInd. In one embodiment, Noise may refer to a Noise array that stores noise metrics corresponding to each of the frequencies of FreqInd.

Method 1000 continues to block 1015 where processing logic initializes the Noise array. In one embodiment, to initialize the Noise array, processing logic stores noise metrics or noise data in Noise array that correspond to operational frequencies of the frequency index (i.e., FreqInd). In another embodiment, processing logic performs listening scans on all the operational frequencies and stores the results in Noise array. Method 1000 continues to block 1020 where processing logic sets the listening frequency to FreqInd. In one embodiment, the listening frequency is 0 as set in block 1010. The listening frequency is the frequency at which that the listening scan (e.g., metric scans 510) is performed.

Method 1000 continues to block 1025 where processing logic performs a listening scan (e.g., metric scans 510). The listening scan may be conducted at the frequency indicated by the frequency index (e.g., FreqInd). In another embodiment, the listening scan may be conducted for one or more frequencies sequentially or in parallel. Method 1000 continues to block 1030 where processing logic saves the listening data from the listening scan to Noise array. In one embodiment, one or more noise metrics are stored in Noise array corresponding to the frequency or frequencies of the listening scan. Method 1000 continues to block 1035 where processing logic sets OpFreq to Min(Noise). OpFreq is the operational frequency (e.g., TX frequency) at which a touch scan may be conducted. Min(Noise) may be the noise metric that indicates the operational frequency with the minimum noise characteristics. In block 1035, processing logic sets the operational frequency to the frequency corresponding to the minimum noise data in the Noise array. Method 1000 continues to block 1040 where processing logic sets the TX frequency to OpFreq as defined by block 1035. In block 1045 of method 1000, processing logic conducts a touch scan (e.g., touch scan 520) to detect the position of a touch proximate the sense array (e.g., sense array 121). The touch scan may be conducted at the TX frequency as set at block 1040 and may be the frequency at which the least noise is detected.

Method 1000 continues to block 1050 where processing logic compares the current number in the frequency index (i.e., FreqInd) to the maximum number of available operational frequencies (i.e., FREQNUM). If FreqInd is not less than FREQNUM, method 1000 moves to block 1055 where processing logic sets FreqInd to zero. If FreqInd is less than FREQNUM, method 1000 moves to block 1060 where processing logic adds one to FreqInd. Method 1000 then returns to block 1020. By looping through method 1200, method 1200 cycles through the operational frequencies and continuously updates noise metric data.

Figure 11:
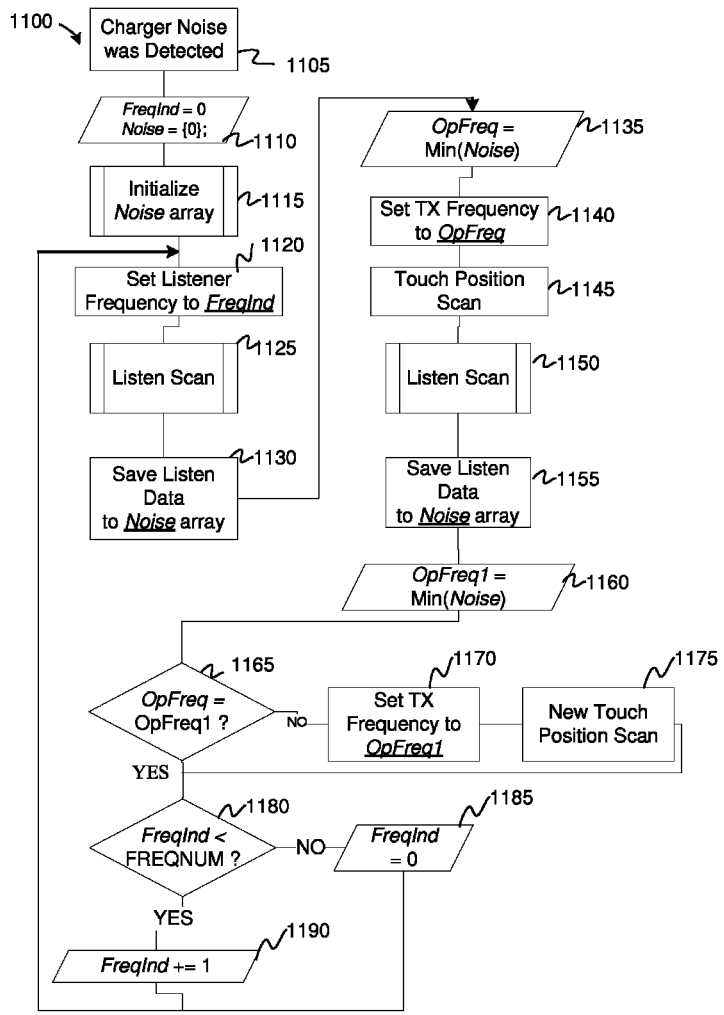
FIG. 11 is a flowchart of a method illustrating auto frequency hopping (AFH), according to another embodiment.

FIG. 11 is a flowchart of a method illustrating auto frequency hopping (AFH), according to another embodiment. Method 1100 extends method 1000 to include a listening scan (e.g., metric scans 510) before and after a touch scan (e.g., touch scan 520). The results of the touch scan may be rejected if the results from the subsequent listening scan show that the external noise has changed (i.e., noise metrics have changed). If the touch scan is rejected, a new scanning sequence may be performed.

In one embodiment, in method 1100 processing logic conducts a listening scan before and after a touch scan (e.g., touch scan 520) in order to detect any changes in the noise signal. Method 1100 begins at block 1105 where processing logic detects noise. In one embodiment, processing logic detects charger noise. In another embodiment, processing logic detects noise from another source, such as LCD noise. In block 1110 of method 1100, processing logic provides the variable, FreqInd, with a value of zero and the variable, Noise, with a value (e.g., Noise={0}) that corresponds to FreqInd=0. FreqInd refers to a frequency index. FreqInd is a pointer to an array of operational frequencies. For example, there may be 4 operational frequencies: 100 kHz, 150 kHz, 250 kHz, and 350 kHz. Corresponding to the 4 operational frequencies, FreqInd may have a value of 0 to 3. FreqInd=0 may refer to 100 kHz and FreqInd=3 may refer to 350 kHz. Noise refers to Noise array that stores listening scan data corresponding to each of the operational frequencies of FreqInd. In one embodiment, Noise may store noise metrics corresponding to each of the frequencies of FreqInd.

Method 1100 continues to block 1115 where processing logic initializes the Noise array. In one embodiment, to initialize the Noise array, processing logic stores noise metrics or noise data in Noise array that correspond to operational frequencies of the frequency index (i.e., FreqInd). Method 1100 continues to block 1120 where processing logic sets the listening frequency to FreqInd. In one embodiment, the listening frequency is 0 as initialized in block 1110. The listening frequency is the frequency at which that the listening scan (e.g., metric scans 510) is performed.

Method 1100 continues to block 1125 where processing logic performs a listening scan (e.g., metric scans 510). The listening scan may be conducted at the frequency indicated by the frequency index. In another embodiment, the listening scan may be conducted for one or more frequencies sequentially or in parallel Method 1100 continues to block 1130 where processing logic saves the listening data from the listening scan to Noise array. In one embodiment, one or more noise metrics are stored in Noise array corresponding to the frequency or frequencies of the listening scan. Method 1100 continues to block 1135 where processing logic sets OpFreq to Min(Noise). OpFreq is the operational frequency (e.g., TX frequency) at which a touch scan may be conducted. In block 1135, processing logic sets the operational frequency to frequency corresponding to the minimum noise data in the Noise array. Method 1100 continues to block 1140 where processing logic sets the TX frequency to OpFreq as defined by block 1135. In block 1145 of method 1100, processing logic conducts a touch position scan (e.g., touch scan 520) to detect the position of a touch proximate the sense array (e.g., sense array 121). The touch scan may be conducted at the TX frequency as set at block 1140 and may be the frequency at which the least noise is detected.

Method 1100 continues to block 1150 where processing logic conducts another listening scan. In one embodiment, conducting a second listening scan ensures that the noise frequency has not changed during the touch scan. In block 1155, processing logic saves the listening data from the listening scan of block 1150 in the Noise array.

In block 1160 of method 1100, processing logic sets OpFreq equal to Min(Noise). OpFreq is another variable for operational frequency. In block 1165, processing logic compares OpFreq to OpFreq1. The two variables OpFreq and OpFreq1 may be compared to identify if the minimum noise frequency changed during the touch scan. If the minimum noise frequency changed during the touch scan, the touch data may be corrupt. If OpFreq and OpFreq1 are not equivalent value, method 1100 proceeds to block 1170 and sets the TX frequency to a new value OpFreq1. Then method 1100 proceeds to block 1175 where processing logic conducts a new touch scan (e.g., touch scan 520).

Method 1100 continues to block 1180 where processing logic compares the current number in the frequency index (i.e., FreqInd) to the maximum number of available operational frequencies (i.e., FREQNUM). If FreqInd is not less than FREQNUM, method 1100 moves to block 1185 where processing logic sets FreqInd to zero. If FreqInd is less than FREQNUM, method 1100 moves to block 1190 where processing logic adds one to FreqInd. Method 1100 then returns to block 1120.

Figures 12A, 12B:
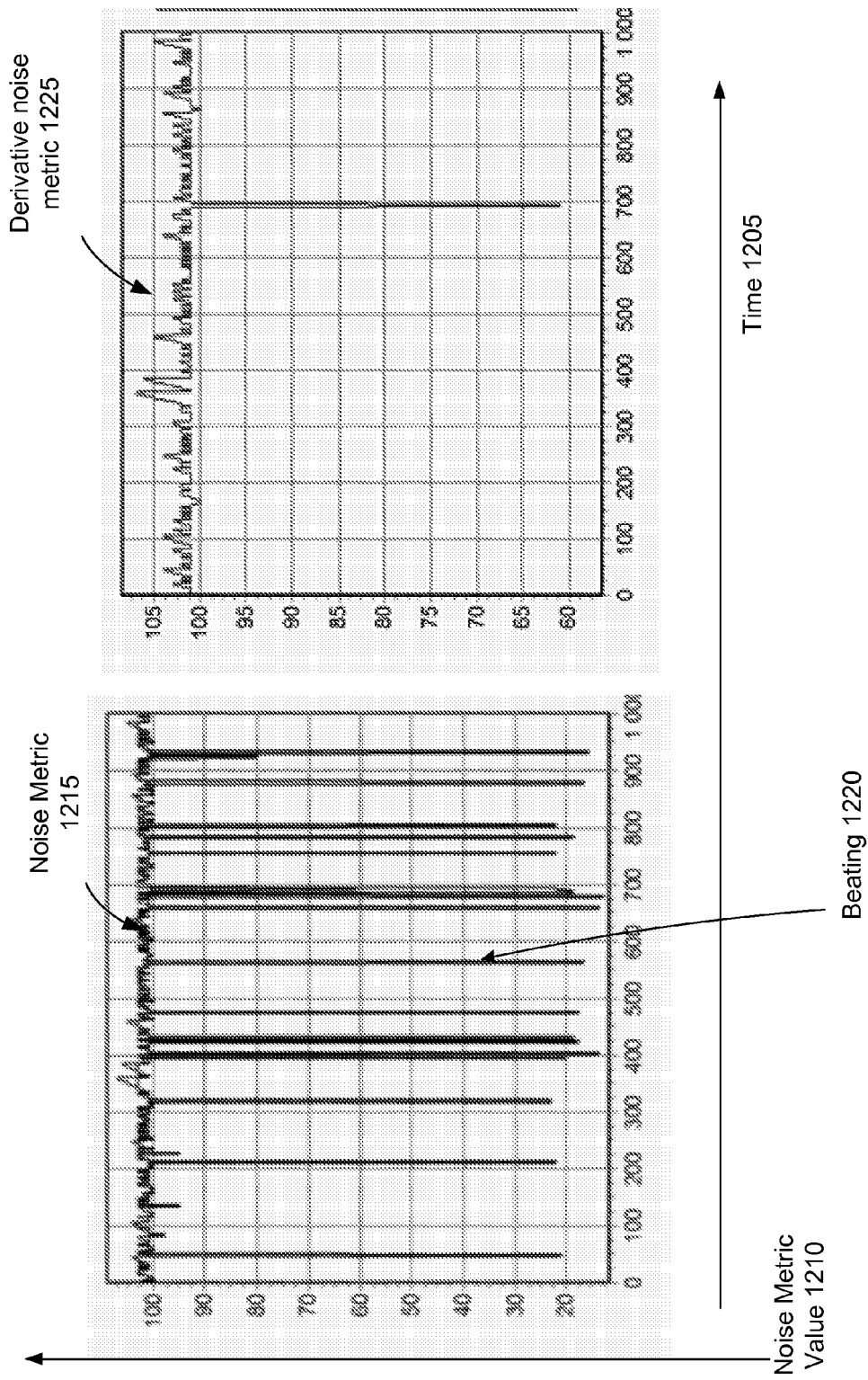
FIG. 12A is an illustration of a noise metric, according to one embodiment.
FIG. 12B is an illustration of a noise metric, according to another embodiment.

FIG. 12A is an illustration of a noise metric, according to one embodiment. In one embodiment, noise metrics or raw data noise for different transmission frequencies may be stored in a table. The noise metrics or raw data noise (a.k.a., noise data) may be dynamically generated, or generated during production and stored into memory. The noise data may show the characteristics of noise for a range of noise frequencies for one or more transmission frequency periods (hop frequencies). For example, the table may consist of one column representing the TX periods and another column representing noise frequency. The table may contain noise data that corresponds to both columns. When selecting a stimulus signal (i.e., hop frequency) from a plurality of stimulus signals, processing logic (e.g., processing logic 120) may selected, from the table, a stimulus signal that has lowest noise response in some external frequency window (i.e., range) and not just at a single noise frequency.

In one embodiment, processing logic (e.g., processing logic 120) adds a derivative to the noise metric in order to make the noise metric more reliable. A noise metric, such as noise metric 1215, may be more than a single number that represents noise. A noise metric (e.g., noise metric 1215) may show noise characteristics over time. Consequently, the noise metric will show the changes of the noise characteristics over time. For example, noise metric 1215 rises and falls in value over time. Further, the noise metric 1215 demonstrates beatings (e.g., beating 1220). That is, noise metric 1215 is lower at certain instances in time. For example, in FIG. 12A, characteristics of noise are reflected by the noise metric value 1210. For a majority of time (e.g., time 1205), noise metric value 1210 is roughly 104. However, for brief instances, noise metric value 1210 drops to values of approximately 20. These drops in noise metric value 1210 may be called beatings (e.g., beating 1220). In another embodiment, any deviation from a consistent noise metric value may be a beating. For example, spikes in a noise metric value may be a beating. In order to create a more stable noise metric, for example, a noise metric with few to no beatings, a derivative of the noise metric may be used.

FIG. 12B is an illustration of a noise metric, according to another embodiment. A derivative may describe how a noise metric changes, for example, the speed at which a noise metric changes. If the noise metric has beatings (e.g., noise metric 1215), the derivative of the noise metric is high. By adding the absolute value of the derivative of the noise metric to, for example, the injected touch (e.g., injected touch 503) noise metric, the influence of the beatings in the noise metric is decreased. A derivative noise metric (e.g., derivative noise metric 1225) is a noise metric generated by adding the absolute value of the derivative of a noise metric to the original noise metric (e.g., noise metric 1215). For example, FIG. 12B shows the derivative noise metric 1225 of noise metric 1215. The resultant derivative noise metric (e.g., derivative noise metric 1225) is a noise metric that is more stable over time, and a noise metric that demonstrates fewer beatings and or beatings of decreased magnitude. In one embodiment, the derivative of a noise metric is calculated based on current and previous noise metric values. In one embodiment, processing logic (e.g., processing logic 120) selects a stimulus signal from the plurality of stimulus signals based on the derivative noise metric.

Figures 13A, 13B:
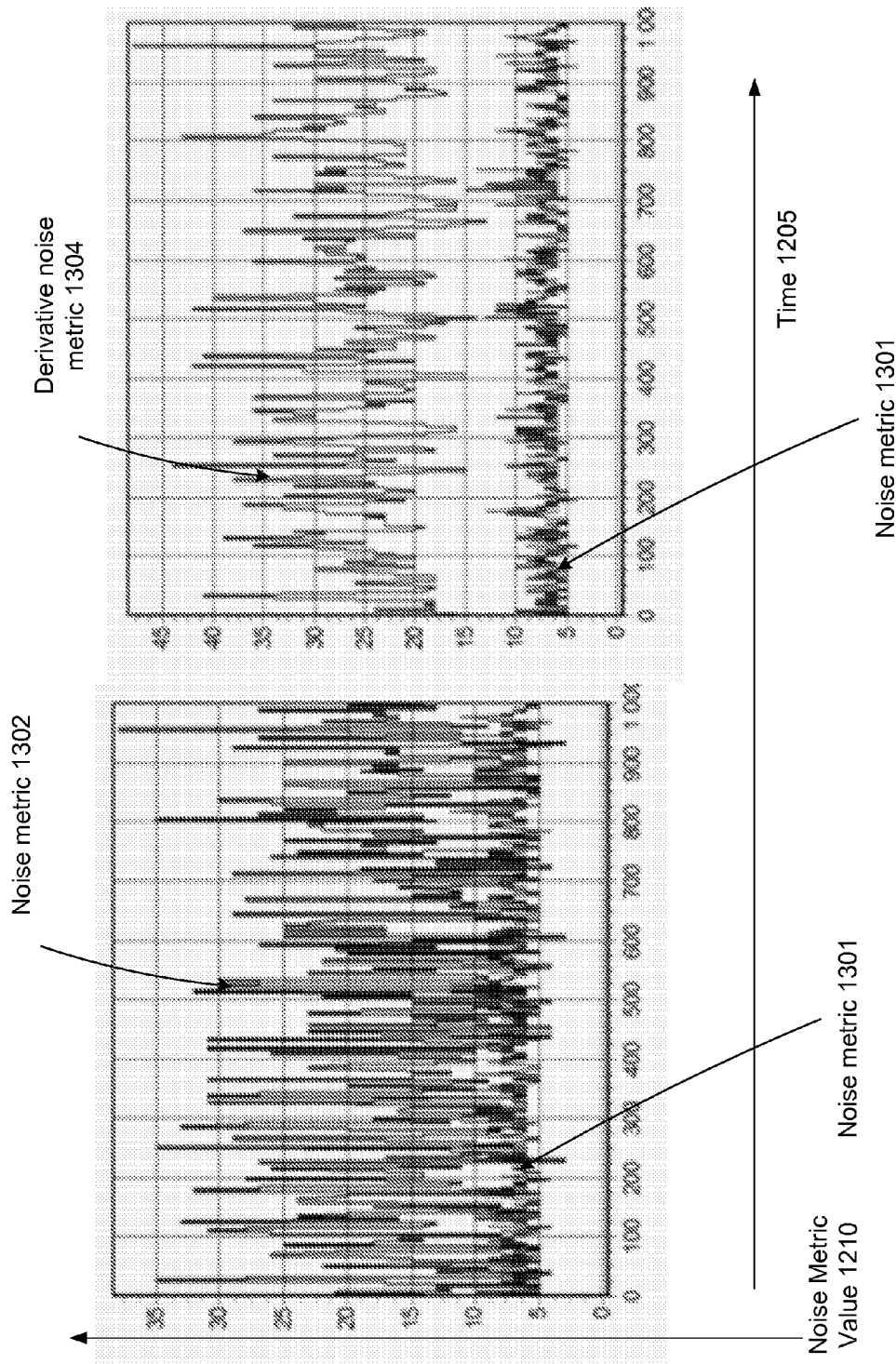
FIG. 13A is an illustration of noise metric measurements at multiple frequencies, according to one embodiment.
FIG. 13B is an illustration of multiple noise metrics, according to another embodiment.

FIG. 13A is an illustration of noise metric measurements at multiple frequencies, according to one embodiment. FIG. 13A shows two overlapping noise metrics, noise metric 1301 and noise metric 1302. Noise metric 1301, measured at frequency F1, is relatively stable and consistent, while noise metric 1302, measured at frequency F2, is relatively noisy. Noise metric 1301 consistently indicates minimum noise response, and a frequency (F1) for which a stimulus signal may be selected. However, because of the overlap of noise metric 1301 and noise metric 1302, processing logic (e.g., processing logic 120) may have difficulty choosing the "right" frequency, or the frequency with the lowest noise response. Adding an absolute derivative to a noise metric can shift the noise metrics (e.g., noise metric 1301 and noise metric 1302) so that distinction may be more readily made.

FIG. 13B is an illustration of multiple noise metrics, according to another embodiment. In FIG. 13B, the absolute value of the derivative of noise metric 1302 has been added to itself, creating derivative noise metric 1304. Consequently, noise metric 1304 has been shifted up, and now may be distinguished from noise metric 1301 more readily. As a result, determining the correct frequency to operate (e.g., frequency at which to transmit a stimulus signal) becomes less complex. In one embodiment, processing logic (e.g., processing logic 120) selects a stimulus signal from the plurality of stimulus signals based on the derivative noise metric.

Figure 14:
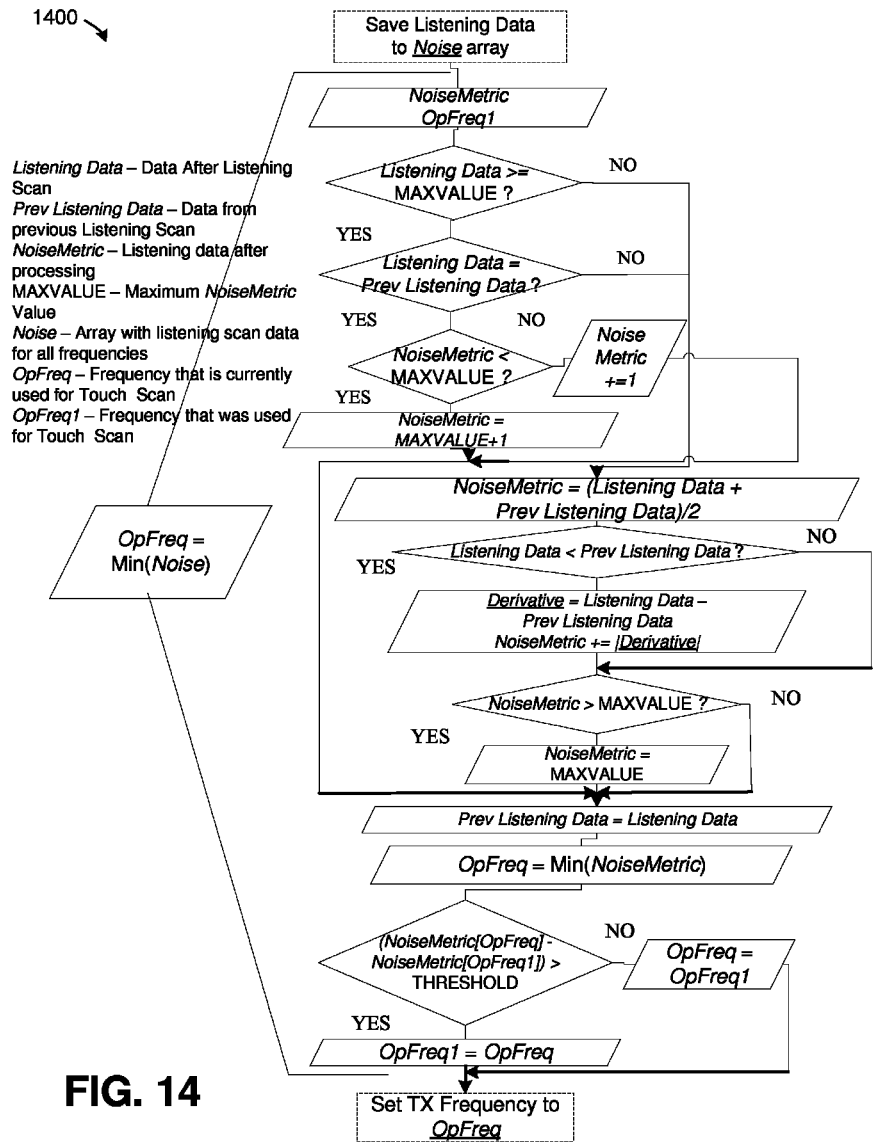
FIG. 14 is a flowchart of a method illustrating smart frequency selection (SFS), according to one embodiment.

FIG. 14 is a flowchart of a method illustrating smart frequency selection (SFS), according to one embodiment. Method 1400 illustrates a smart frequency selection method that may be used to determine the optimum frequency at with to perform a touch scan (e.g., touch scan 520). In method 1400, processing logic compares the listening data (e.g., noise metrics) to the maximum possible value stored in MAXVALUE. If the two values are equal and the current listening data from the current listening scan is equal to the listening data from the previous listening scan, SFS increases the noise metric value. Consequently, if the listening data is continuously high from scan to scan, the noise metric slowly counts up. A continuously high noise metric describes a bad frequency at which to operate. If a different noise metric has rare or infrequent beatings, SFS selects the noise metric with beatings rather than noise metrics that are continuously high.

In method 1400, if the listening data is not continuously high, then listening data is filtered by a Low Pass Filter (LPF) and assigned a noise metric. The LPF listening data includes the average of the current and previous listening scans. Method 1400 continues by comparing listening data. If the listening data decreases, the absolute value of the derivative of the listening data is added to the noise metric (further described in FIG. 12B). The sum of the listening data and the absolute value of the derivative of the listening data may be higher than MAXVALUE. Consequently, the noise metric is checked against MAXVALUE to determine if the noise metric has exceeded MAXVALUE.

Method 1400 continues where processing logic updates the listening data value. Method 1400 then continues where processing logic chooses the minimum of all available noise metrics for all frequencies. The chosen frequency is assigned to the OpFreq variable, which represent the optimum operation frequency.

In another embodiment, method 1400 may apply some hysteresis to noise metrics. Often, switching over two noise metrics that are close to each other or react on small differences between them may bring little benefit. If the difference between two noise metrics OpFreq and OpFreq1 is smaller than a THRESHHOLD, SFS continues working with the previous frequency OpFreq1.

Figure 15:
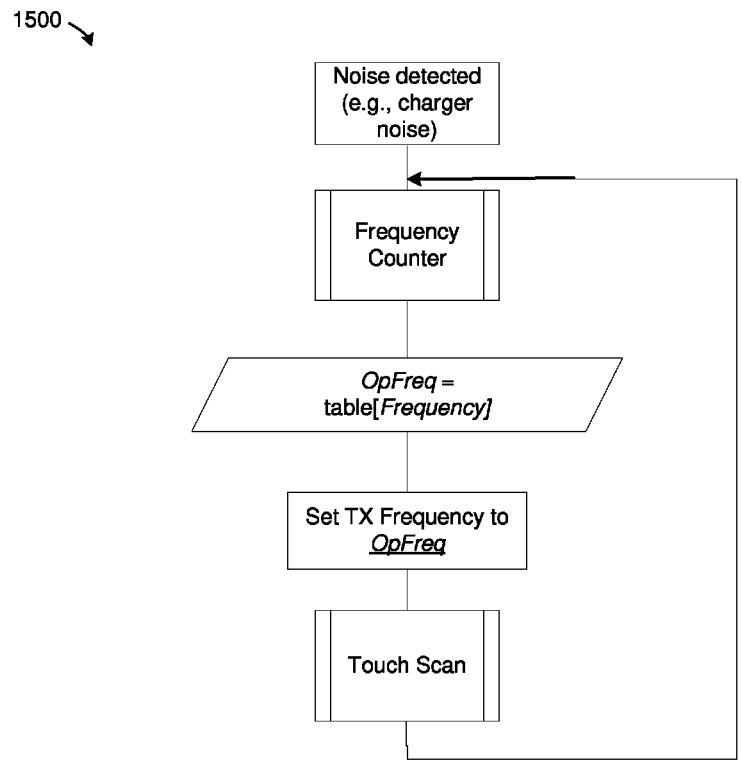
FIG. 15 is a flowchart of a method illustrating auto frequency hopping (AFH) implementing a counter, according to another embodiment.

FIG. 15 is a flowchart of a method illustrating auto frequency hopping (AFH) implementing a counter, according to another embodiment. Different raw noise data filtration method may be effective for different external noise frequencies. The median filter may be effective for noise frequencies 5 to 10 times lower than the TX frequency. The Window Hann filter may be effective for noise frequencies close to TX frequencies. A special frequency dependent noise metric may be used for median and Window Hann filter switching. Frequency dependent noise may be calculated by the number of times ADC samples cross a threshold value during a listening scan (e.g., metric scans 510).

In an alternative embodiment, frequencies of external noise may be measured directly. Noise data from the direct measurements may be used for Window Hann and median filter switching. For example, an external noise frequency applied to a sensing system (e.g., electronic system 200) may be measured directly. All RX electrodes (e.g., receive electrode 223) may be connected together at an input of a transimpedance amplifier (TIA) (not shown). External noise may create current pulses on the RX lines that transform to voltage on the TIA output. A comparator (CMP) (not shown) may be part of the listening scan hardware. The comparator output may be read by firmware. The firmware counts the number of pulses during a time interval defined by a firmware gate (not shown) For example, for a gate time of 3 mS, the frequency counter resolution is 166 Hz when the firmware counts both edges of a clock pulse.

In an alternative embodiment, counting may occur between pulses. Such an implementation may improve frequency counter resolution for small frequencies. For low frequencies, such as below 10 kHz, it may be beneficial to count time between pulses instead of the number of pulses.

Additionally, a switching algorithm with hysteresis may be implemented in firmware in order to decrease the measurement time at low frequencies while keeping the same resolution.

In another embodiment, a frequency counter uses two comparators. Each comparator may have its own reference voltage. The second comparator with a high reference voltage can be used to measure only high amplitude signals. Such an implementation may make the output of the frequency counter more clear with certain types of noise, such as LCD noise and charger noise with complicated noise characteristics.

In one embodiment, a frequency counter may be used as a noise metric in AFH. If the frequency of external noise has a narrow bandwidth, the frequency counter data may be used as a noise metric. In one implementation, a noise frequency to TX period look up table with pre-calculated optimal operation frequencies for all possible external noise frequencies is created. As a result, touch scans may be performed at a minimum noise frequency to provide to provide an optimum performance.

Method 1500 may be executed when noise is detected, such as charger noise. Processing logic may use a listening scan to measure the frequency of the external noise. The frequency counter may return a frequency number based on the measured frequency. The frequency number may be converted to a TX period (e.g., the TX period may be a range of TX frequencies) by using a look up table (i.e., table). For each noise frequency, the operational frequency (i.e., OpFreq) for a touch scan may be chosen from the table. The table may be built only once. For example, the table may be built during development. Each look up table element points to the optimal operation TX period for each frequency counter value.

Figure 16:
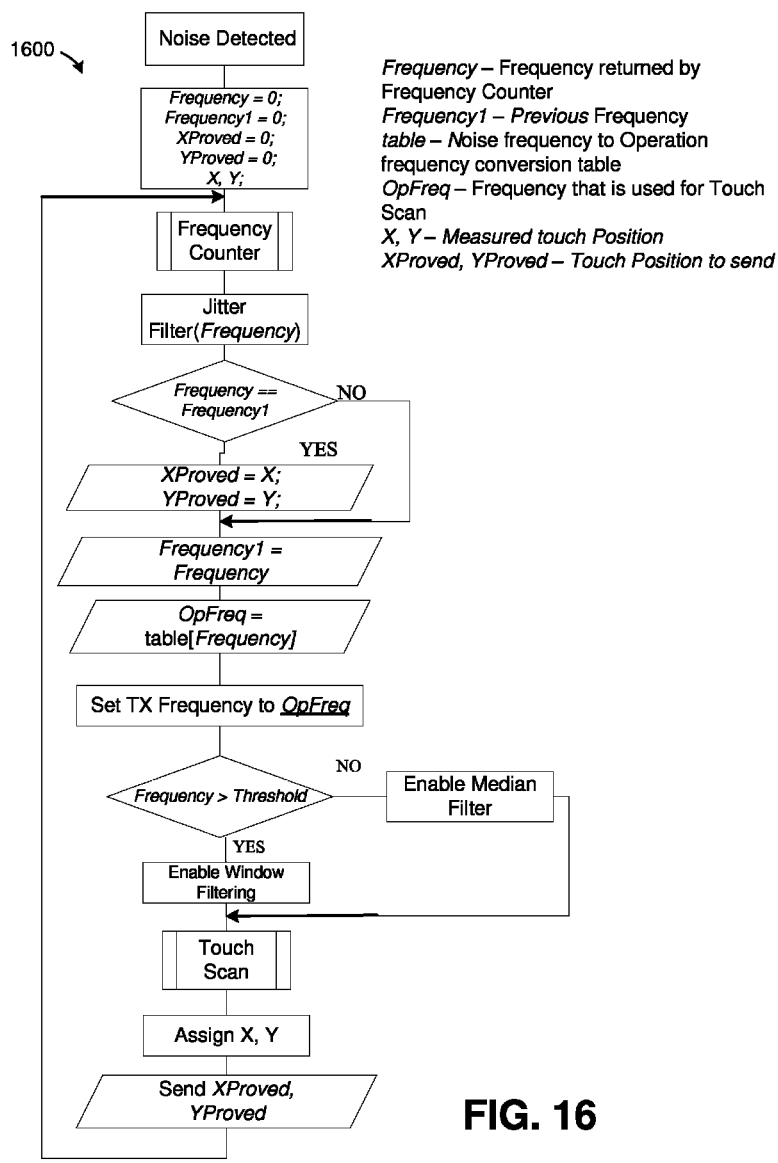
FIG. 16 is a flowchart of a method illustrating auto frequency hopping (AFH) implementing a counter, according to another embodiment.

FIG. 16 is a flowchart of a method illustrating auto frequency hopping (AFH) implementing a counter, according to another embodiment. Method 1600 is similar to method 1500, except that method 1600 adds a frequency jitter filter, a frequency changing check, and Window Hann and median filter switching.

In one embodiment, method 1600 includes a jitter filter to remove the frequency counter output toggling between plus 1 and minus 1, and to remove unnecessary frequency hops. The external noise frequency may change during a touch scan. A change in external noise frequency during a scan may cause the sensing system (e.g., electronic system 200) to operate at a less than optimal operational frequency and result in additional touch position jitter. As a result, a special check may be performed by the frequency jitter filter to detect jitter. In one embodiment, processing logic checks to see if the current measured frequency is equal to the previously measured frequency. If the two frequencies are equal, then the touch position (e.g., X- and Y-coordinates) may be assigned to the variables XProved and YProved. If the two frequencies are not equal, then the previous touch data may be reported.

Figure 17:
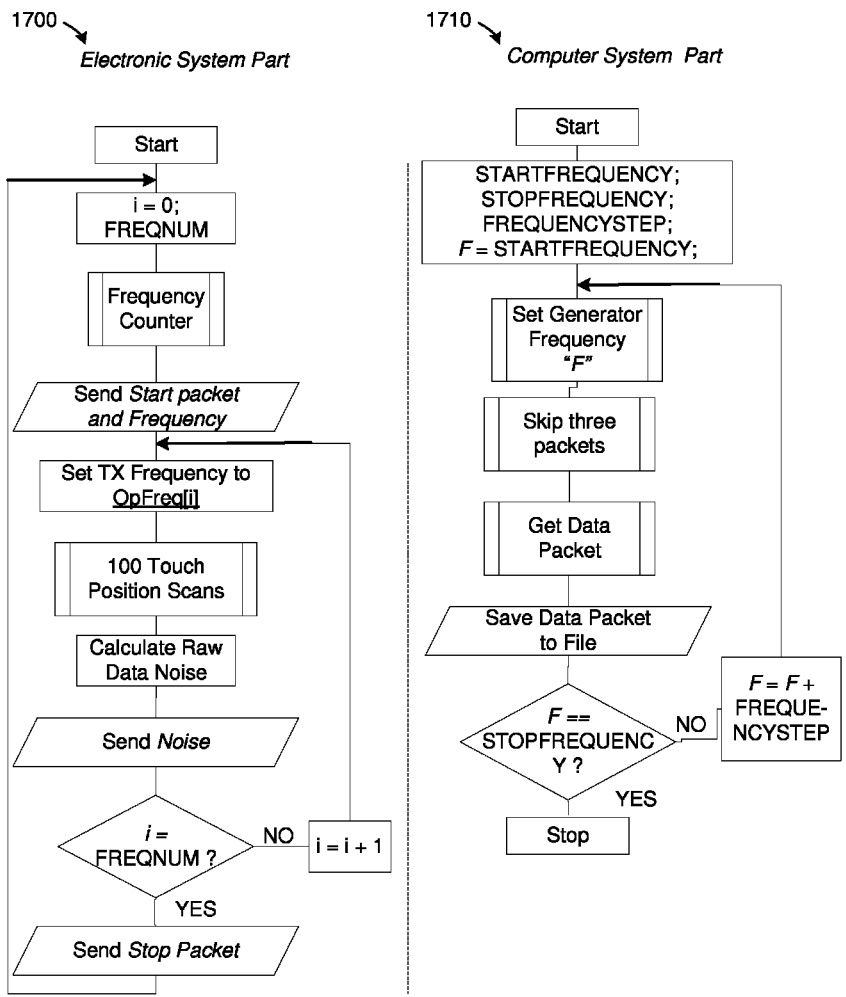
FIG. 17 is a flowchart of a method illustrating the generation of a look up table, according to one embodiment.

FIG. 17 is a flowchart of a method illustrating the generation of a look up table, according to one embodiment. FIG. 17 presents two methods, method 1700 and method 1710, intended to be used together to generate noise frequency to TX period look up tables. Method 1700 may be performed on a sensing system, such as electronic system 100 in FIG. 1 or electronic system 200 in FIG. 2, to collect data. Method 1710 may use the raw data collected in method 1700 to compute values for the look up table. In one embodiment, a computer system, such as a PC running MatLab, may be used to calculate the look up table. In another embodiment, a host (e.g., host 150) may process the raw data collected in method 1700.

In one embodiment, three steps may be performed during AFH component development to generate the noise frequency to TX Period look up table. First, the frequency range (e.g., TX period) and the number of frequencies to hop may be selected. Second, the frequency counter data and the raw noise data may be collected. Third, the frequency counter data and the raw noise data may be analyzed to generate the noise frequency to TX Period look up table.

In one embodiment, in order to select the frequency range and the number of frequencies to hop, the external noise frequency range may be defined. For example, a test frequency range may be defined for frequencies between 1 kHz and 500 kHz. The range of frequencies may be wider or narrower. The number of hop frequencies may be any number. For example, two, three, four, or more frequencies may be used.

In one embodiment, the frequency counter data and the jitter data is collected. For example, the external noise frequency, the frequency counter output, and the raw jitter data corresponding to operational frequencies (e.g., TX periods) may be collected at the same time. In method 1700, processing logic measures the external noise frequency. Method 1700 continues where processing logic performs one hundred touch scans (e.g., touch scan 520). In another embodiment, the number of touch scans may be more or less than one hundred scans. Based on the touch data collected from the touch scans, processing logic calculates the raw noise data. These steps may be repeated for all hop frequencies (e.g., operational frequencies). The external noise frequency data and the raw noise data may be sent to a host or external computer on which method 1710 may be performed.

In one embodiment, method 1710 sets the generator frequency to STARTFREQUENCY. Three full data packets may be skipped to exclude false readings. The fourth data packet may be saved to a storage location. If the current generator frequency, F, does not equal the STOPFREQUENCY, F is increased and the loop repeats. The FREQUENCYSTEP value may be at least two times smaller than the expected width between the table entries. For example, FREQUENCYSTEP maybe set to 100 Hz and the look up table may be generated with 1 kHz steps. The STARTFREQUENCY may be 500 Hz and the STOPFREQUENCY 500 kHz.

In one embodiment, the measured data is analyzed to generate a noise frequency to TX Period look up table. Look up table generation may be frequency independent. The look up table may not depend on internal main oscillator frequency, and may be used to determine the optimal operation frequency for all frequency counter values.

The processing logic (e.g., processing logic 102) can be implemented in a capacitive touch screen controller. In one embodiment, the capacitive touch screen controller is the TrueTouch® capacitive touchscreen controllers, such as the CY8CTMA3xx family of TrueTouch® Multi-Touch All-Points touchscreen controllers, developed by Cypress Semiconductor Corporation of San Jose, Calif. The TrueTouch® capacitive touchscreen controllers sensing technology to resolve touch locations of multiple fingers and a stylus on the touch-screens, supports operating systems, and is optimized for low-power multi-touch gesture and all-point touchscreen functionality. Alternatively, the touch position calculation features may be implemented in other touch-screen controllers, or other touch controllers of touch-sensing devices. In one embodiment, the touch position calculation features may be implemented with other touch filtering algorithms as would be appreciated by one of ordinary skill in the art having the benefit of this disclosure.

The embodiments described herein may be used in various designs of mutual-capacitance sensing systems, in self-capacitance sensing systems, or combinations of both. In one embodiment, the capacitance sensing system detects multiple sense elements that are activated in the array, and can analyze a signal pattern on the neighboring sense elements to separate noise from actual signal. The embodiments described herein are not tied to a particular capacitive sensing solution and can be used as well with other sensing solutions, including optical sensing solutions, as would be appreciated by one of ordinary skill in the art having the benefit of this disclosure.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "inducing," "computing," "receiving," "processing," "selecting," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method of detecting a touch proximate to a touch sensing surface, comprising:
   at a processing device coupled to the touch sensing surface, wherein the touch sensing surface includes a capacitive sense array that is configured to generate touch data associated with the detected touch, and the processing device is configured to operate a scanning sequence including a listening scan and a touch scan of the capacitive sense array;
   measuring noise during the listening scan, including:
      disabling stimulus signals that drive the capacitive sense array; and
      simulating a touch event by inducing a surrogate touch current in the processing device to produce data that mimics the touch scan with a conductive object disposed at a known location on the capacitive sense array;
   computing, using the produced data, an estimate of a noise metric based on the injected touch;
   in accordance with the computed estimate of the noise metric, selecting a stimulus signal from a plurality of stimulus signals for the touch scan; and
   while driving the capacitive sensing array with the selected stimulus signal, collecting touch data indicative of the touch detected proximate to the capacitive sense array during the touch scan of the capacitive sense array.

2. The method of claim 1, wherein the known location comprises one or more cells of a plurality of cells of the capacitive sense array where the detected touch proximate to the sense array occurs.

3. The method of claim 1, wherein measuring noise during the listening scan further includes measuring the noise in accordance with a plurality of frequencies, and the estimate of the noise metric is computed in accordance with the plurality of frequencies.

4. The method of claim 3, wherein the noise is measured for the plurality of frequencies in parallel.

5. The method of claim 1, wherein simulating the touch event comprises inducing an injected touch internal to a receiving circuit, and wherein the produced data of the touch event is processed in an equivalent signal path to touch data from a touch proximate to the sense array present during the touch scan of the sense array.

6. The method of claim 5, wherein the receiving circuit is used in a capacitance-sensing circuit.

7. The method of claim 1, wherein the noise metric is indicative of noise characteristics of noise on the sense array.

8. The method of claim 7, wherein the selected stimulus signal has a minimum noise response.

9. An apparatus, comprising
   a processing device coupled to a touch sensing surface, wherein the touch sensing surface includes a capacitive sense array that is configured to generate touch data associated with a touch proximate to the touch sensing surface, and the processing device is configured to:
   operate a scanning sequence including a listening scan and a touch scan of the capacitive sense array;
   measure noise during the listening scan, including:
      disabling stimulus signals that drive the capacitive sense array; and
      simulating a touch event by inducing a surrogate touch current in the processing device to produce data that mimics the touch scan with a conductive object disposed at a known location on the capacitive sense array;
   compute, using the produced data, an estimate of a noise metric based on the injected touch;
   in accordance with the computed estimate of the noise metric, selecting a stimulus signal from a plurality of stimulus signals for the touch scan; and
   while driving the capacitive sensing array with the selected stimulus signal, collecting touch data indicative of the touch detected proximate to the capacitive sense array during the touch scan of the capacitive sense array.

10. The apparatus of claim 9, wherein the known location comprises one or more cells of a plurality of cells of the capacitive sense array where the detected touch proximate to the sense array occurs.

11. The apparatus of claim 9, wherein measuring noise during the listening scan, further includes measuring the noise for a plurality of frequencies, and the estimate of the noise metric is computed in accordance with the plurality of frequencies.

12. The apparatus of claim 11, wherein during the listening scan, the noise is measured for the plurality of frequencies in parallel.

13. The apparatus of claim 9, wherein the processing device is further configured to induce an injected touch internal to a receiving circuit, and wherein the processing device is further configured to process the produced data of the touch event in an equivalent signal path to touch data from a touch proximate to the sense array present during the touch scan of the sense array.

14. The apparatus of claim 13, wherein the receiving circuit is used in a capacitance-sensing circuit.

15. The apparatus of claim 9, wherein the noise metric is indicative of noise characteristics of noise on the sense array.

16. The apparatus of claim 15, wherein the selected stimulus signal has a minimum noise response.

17. An electronic system, comprising:
   a capacitive sense array configured to generate touch data for a touch detected proximate to the capacitive sense array, the touch data represented as a plurality of cells; and
   a processing device coupled to the capacitive sense array, wherein the processing device is configured to:
   operate a scanning sequence including a listening scan and a touch scan of the capacitive sense array;
   measure noise during the listening scan, including:
      disabling stimulus signals that drive the capacitive sense array; and
      simulating a touch event by inducing a surrogate touch current in the processing device to produce data that mimics the touch scan with a conductive object disposed at a known location on the capacitive sense array;
   compute, using the produced data, an estimate of a noise metric based on the injected touch;
   in accordance with the computed estimate of the noise metric, selecting a stimulus signal from a plurality of stimulus signals for the touch scan; and
   while driving the capacitive sensing array with the selected stimulus signal, collecting touch data indicative of the touch detected proximate to the capacitive sense array during the touch scan of the capacitive sense array.

18. The electronic system of claim 17, wherein the processing device is further configured to induce an injected touch internal to a receiving circuit, and wherein the processing device is further configured to process the produced data of the touch event in an equivalent signal path to touch data from a touch proximate to the sense array present during the touch scan of the sense array.

19. The electronic system of claim 17, wherein measuring noise during the listening scan includes measuring the noise in accordance with a plurality of frequencies, and the estimate of the noise metric is computed in accordance with the plurality of frequencies.

20. The electronic system of claim 19, wherein during the listening scan, the noise is measured for the plurality of frequencies in parallel.

\* \* \* \* \*